(12) United States Patent
Sakai et al.

(10) Patent No.: US 9,230,924 B2
(45) Date of Patent: Jan. 5, 2016

(54) METHOD OF PRODUCING SEMICONDUCTOR MODULE AND SEMICONDUCTOR MODULE

(71) Applicant: SHARP KABUSHIKI KAISHA, Osaka-shi, Osaka (JP)

(72) Inventors: Takae Sakai, Osaka (JP); Masahiro Murakami, Osaka (JP); Masahiko Kushino, Osaka (JP); Yoshihisa Amano, Osaka (JP); Shinichi Tokuno, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 0 days.

(21) Appl. No.: 14/728,675

(22) Filed: Jun. 2, 2015

(65) Prior Publication Data

US 2015/0303155 A1    Oct. 22, 2015

Related U.S. Application Data

(62) Division of application No. 13/470,029, filed on May 11, 2012, now Pat. No. 9,076,892.

(30) Foreign Application Priority Data

May 13, 2011 (JP) ................. 2011-108159
Feb. 14, 2012 (JP) ................. 2012-029803

(51) Int. Cl.
*H01L 21/78* (2006.01)
*H01L 23/60* (2006.01)
*H01L 21/56* (2006.01)

(52) U.S. Cl.
CPC ............. *H01L 23/60* (2013.01); *H01L 21/563* (2013.01); *H01L 21/78* (2013.01)

(58) Field of Classification Search
CPC ...................................................... H01L 21/82
USPC ......................................... 438/110, 112, 114
See application file for complete search history.

(56) References Cited

U.S. PATENT DOCUMENTS

| | | | |
|---|---|---|---|
| 6,649,448 B2 | 11/2003 | Tomihara | |
| 6,853,089 B2 | 2/2005 | Ujiie et al. | |
| 6,913,950 B2 | 7/2005 | Kobayakawa | |
| 6,946,554 B2 | 9/2005 | Elliott et al. | |
| 7,648,891 B2 | 1/2010 | Farooq et al. | |

(Continued)

FOREIGN PATENT DOCUMENTS

| | | |
|---|---|---|
| CN | 101401206 A | 4/2009 |
| CN | 101645436 A | 2/2010 |
| JP | 2004-172176 A | 6/2004 |

*Primary Examiner* — Earl Taylor
(74) *Attorney, Agent, or Firm* — Birch, Stewart, Kolasch & Birch, LLP

(57) ABSTRACT

In order to securely ground an exterior shield and reduce burden imposed on a dicing blade and the exterior shield, a method of producing a semiconductor module comprises a hole-forming step of forming a hole 30 extending from a top surface of a sealing resin layer 3 to a ground wiring 111 (112) provided at a collective substrate 100, a film-forming step of forming an electrically conductive film made of an electrically conductive material so as to cover at least the top surface of the sealing resin layer 3, an internal surface of the hole 20, and the ground wiring 111 (112), and a separation step of separating from each other a plurality of individual module sections which the individual module section comprises.

8 Claims, 41 Drawing Sheets

(56) References Cited

U.S. PATENT DOCUMENTS

| | | |
|---|---|---|
| 8,399,963 B2 | 3/2013 | Tsai et al. |
| 2002/0153582 A1 | 10/2002 | Takehara et al. |
| 2003/0052419 A1 | 3/2003 | Ujiie et al. |
| 2008/0012096 A1 | 1/2008 | Sin et al. |
| 2008/0150087 A1 | 6/2008 | Farooq et al. |
| 2008/0210462 A1 | 9/2008 | Kawagishi et al. |
| 2009/0091904 A1 | 4/2009 | Hatanaka et al. |
| 2009/0093104 A1 | 4/2009 | Arita et al. |
| 2009/0294930 A1 | 12/2009 | Yoon et al. |
| 2010/0032815 A1 | 2/2010 | An et al. |
| 2012/0286415 A1 | 11/2012 | Sakai et al. |
| 2012/0319297 A1 | 12/2012 | Yen et al. |

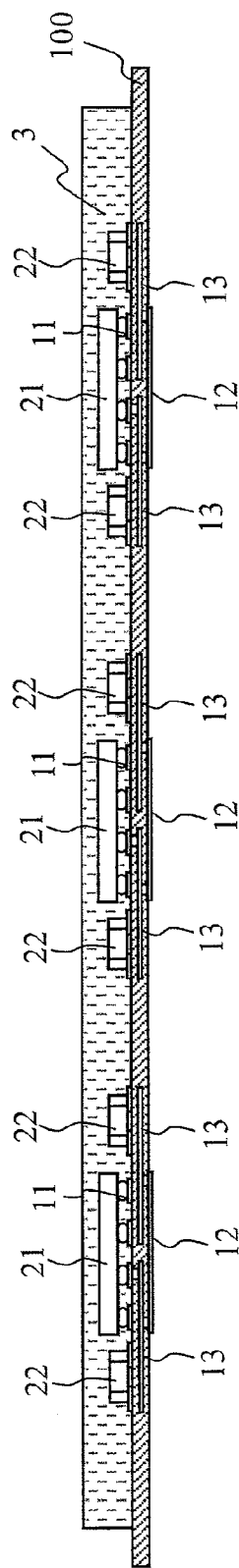

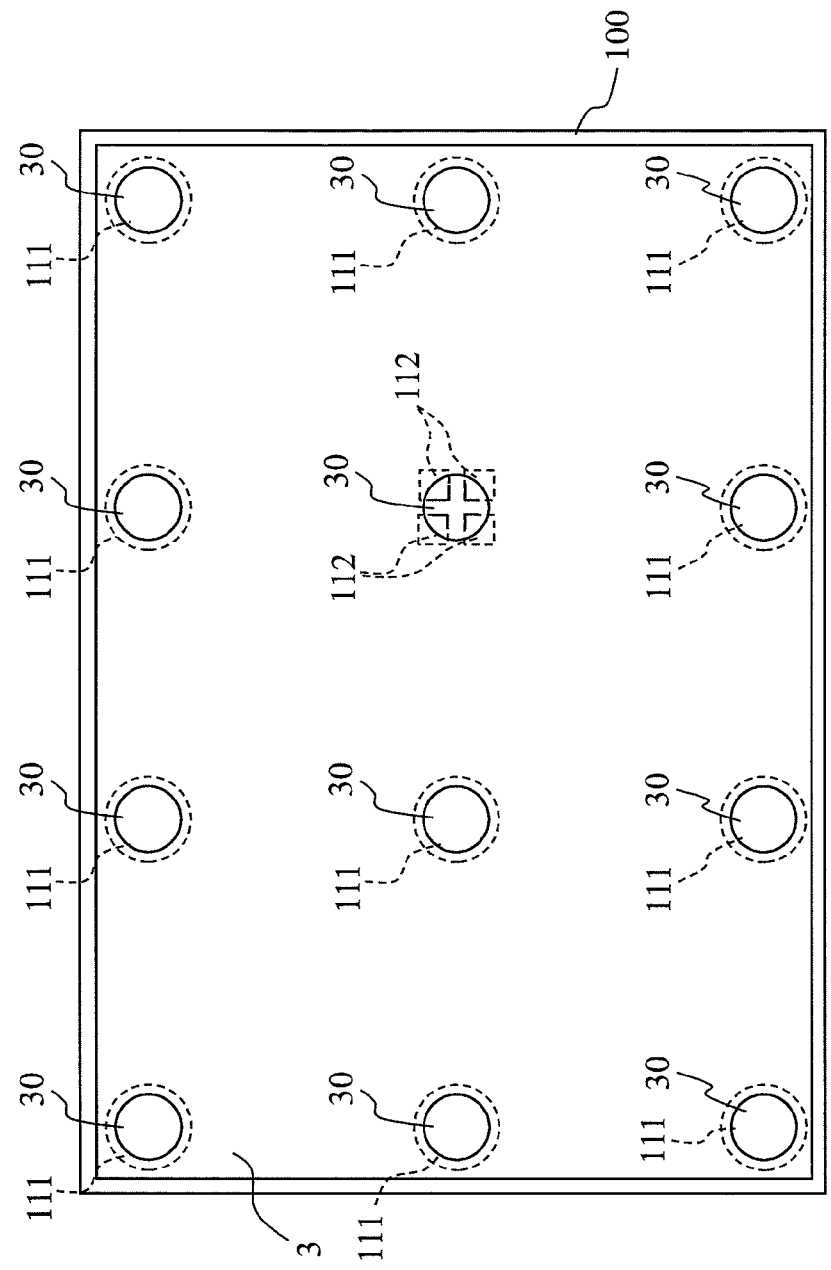

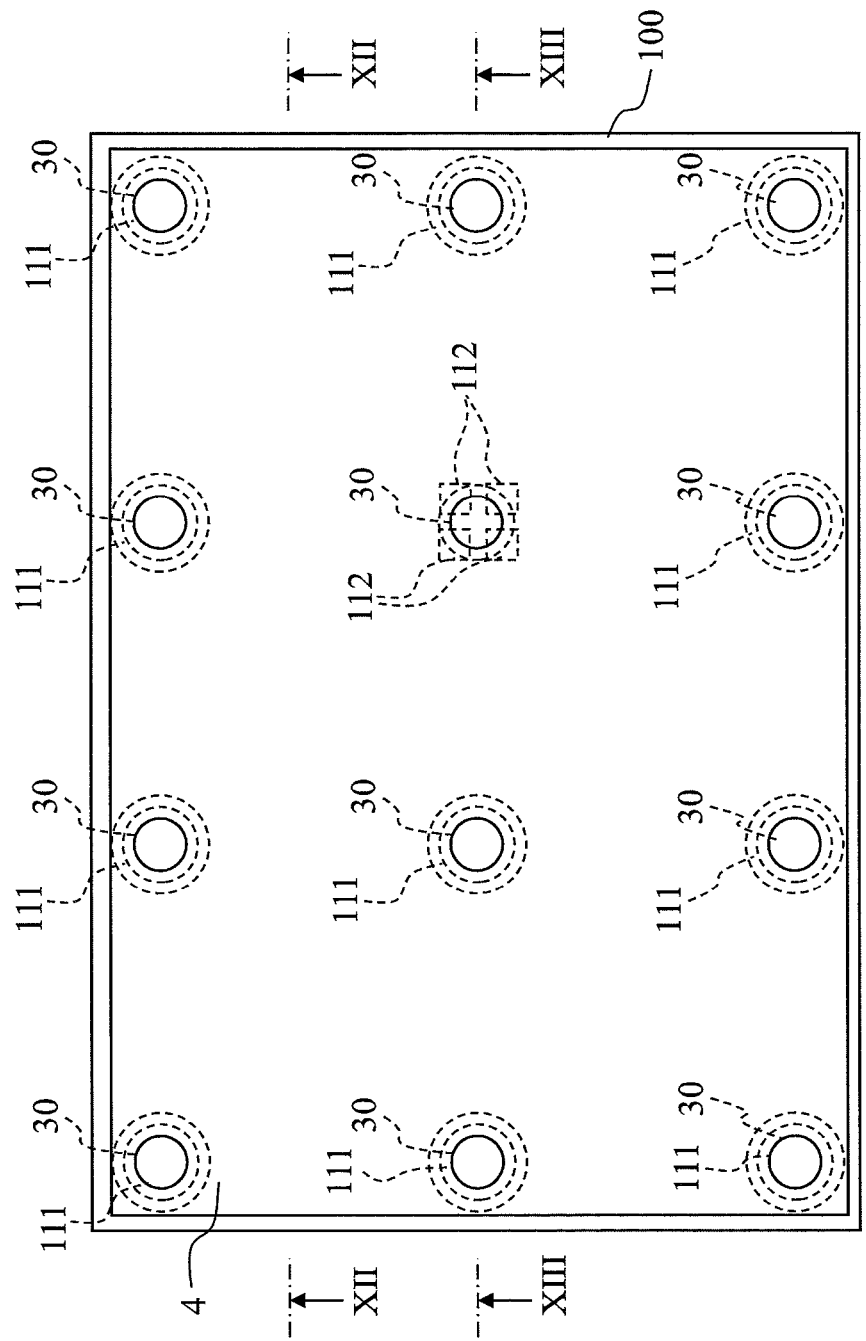

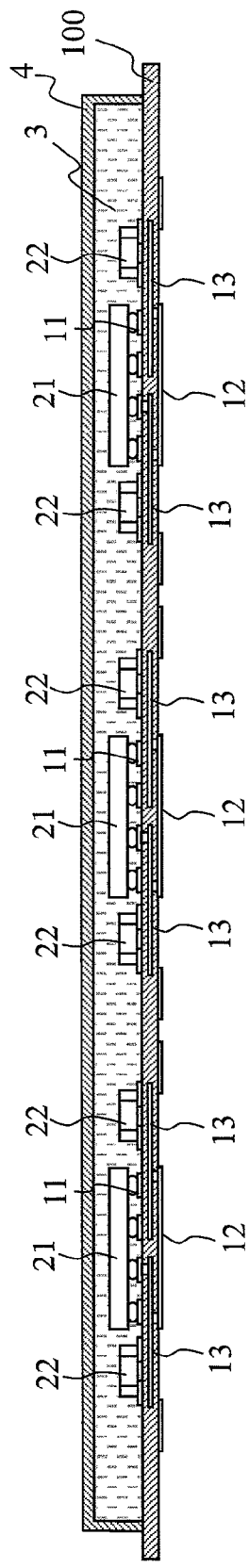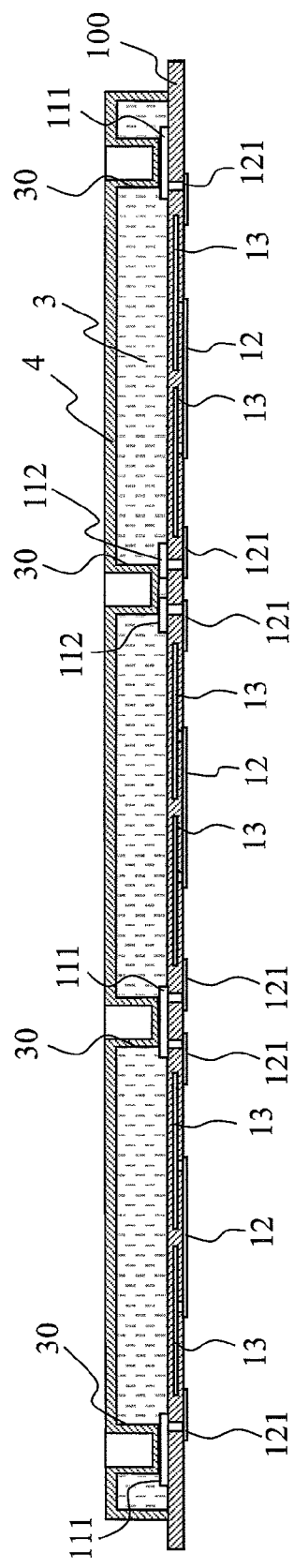

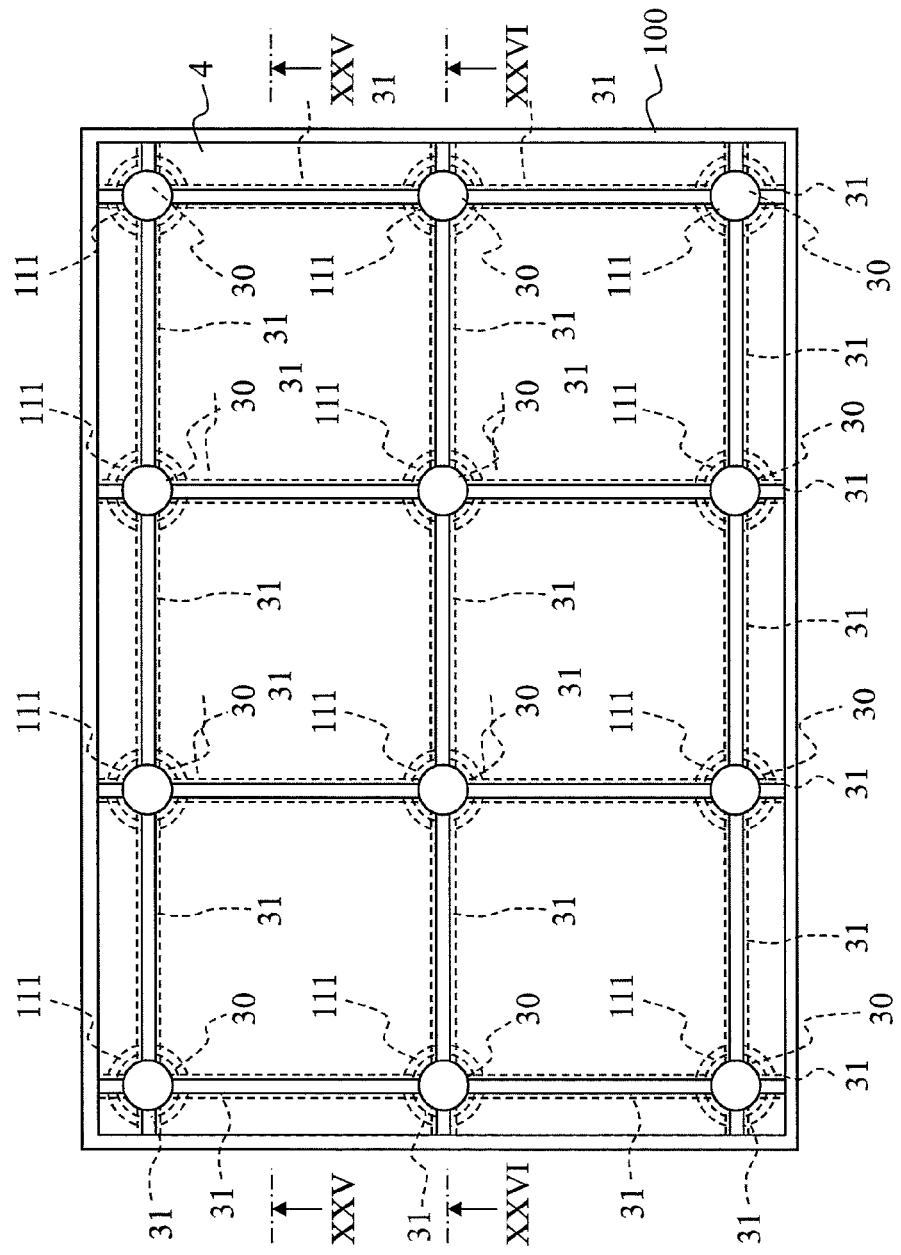

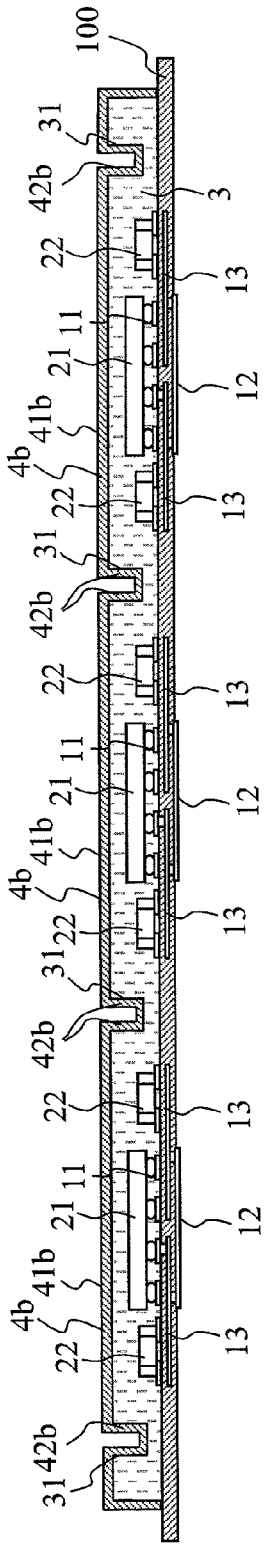
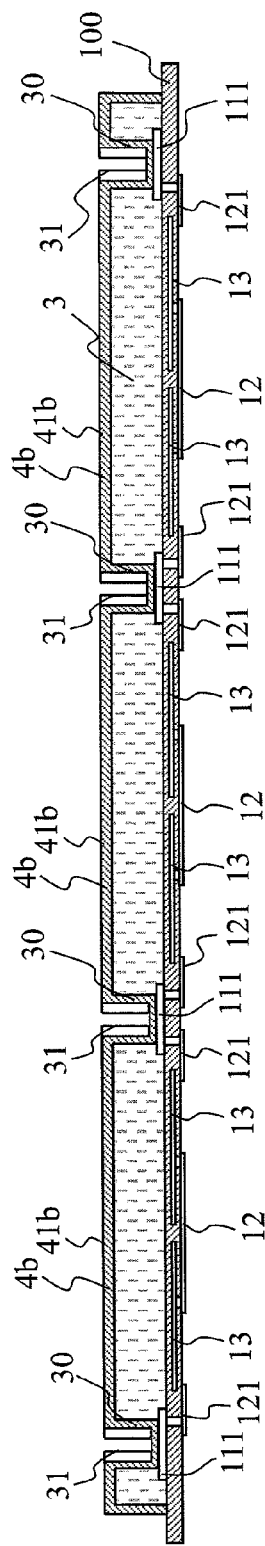
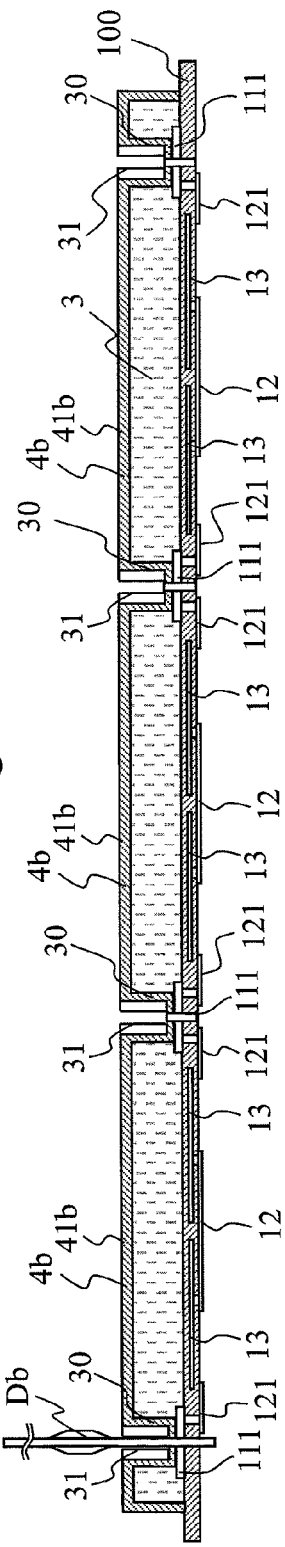

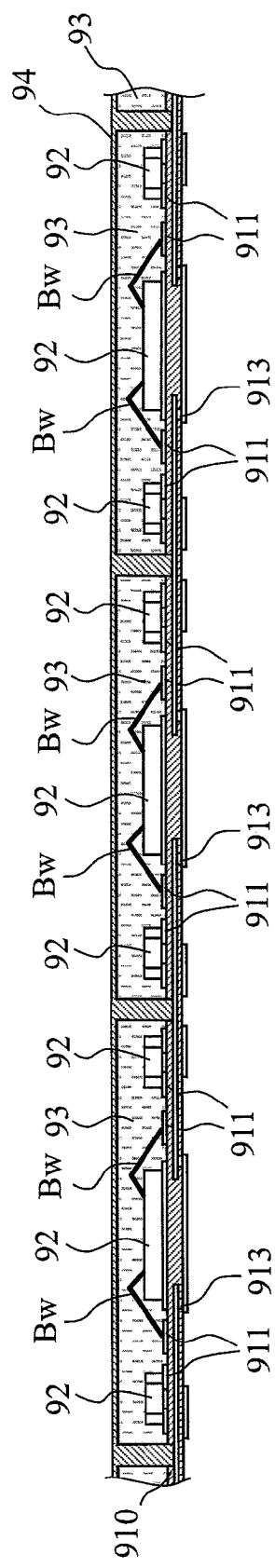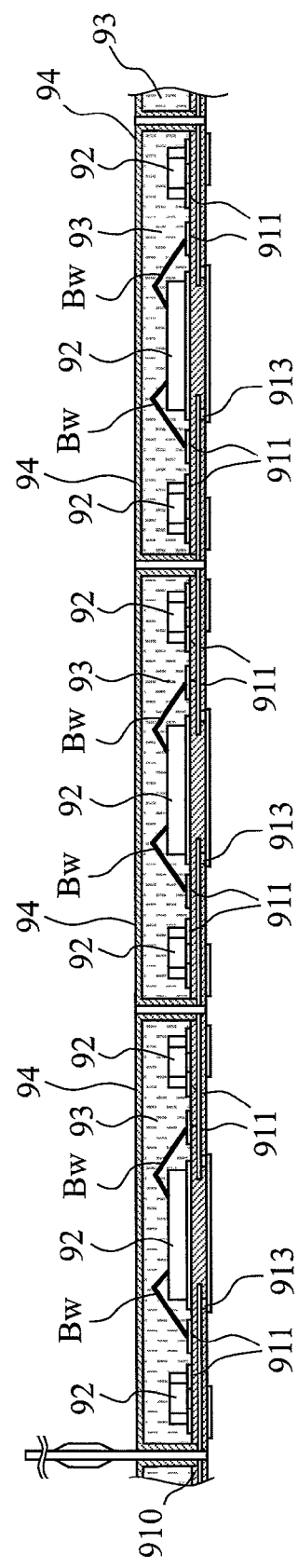

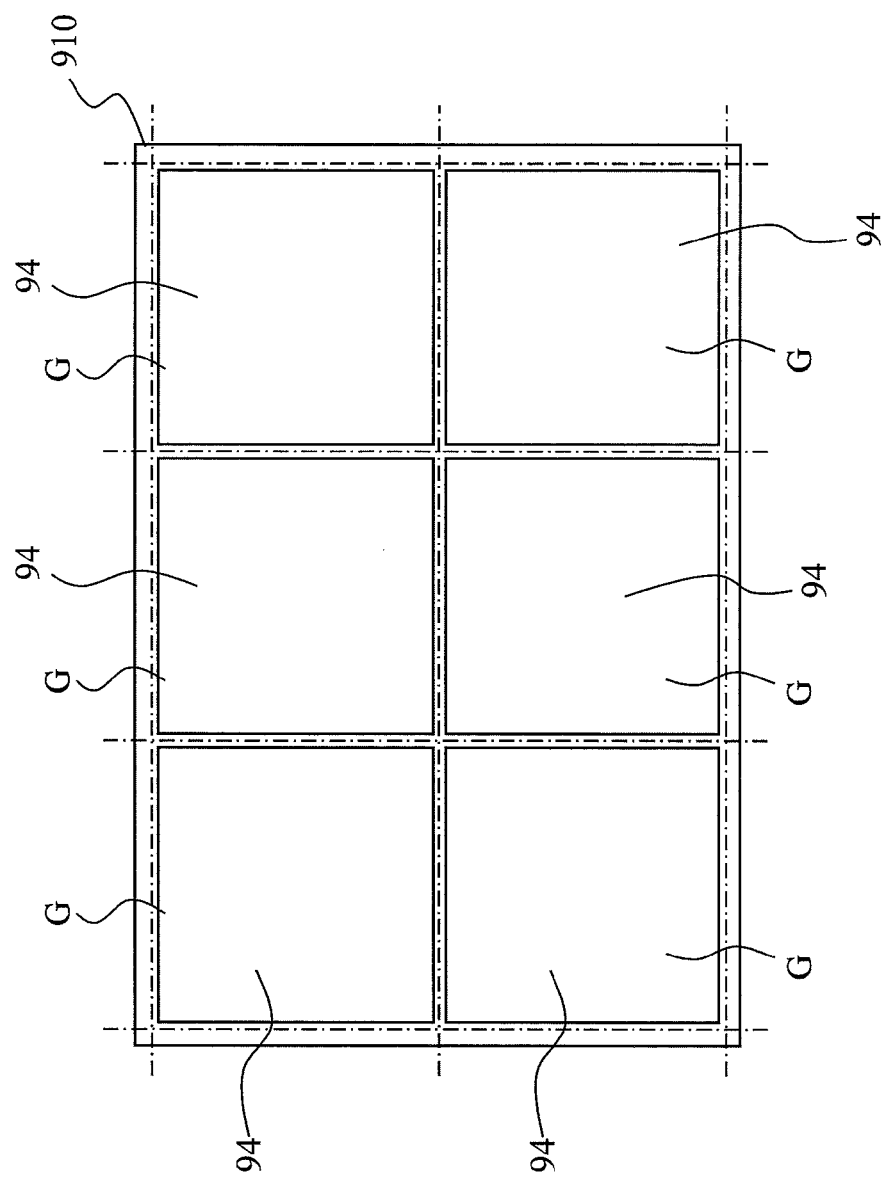

Fig.57
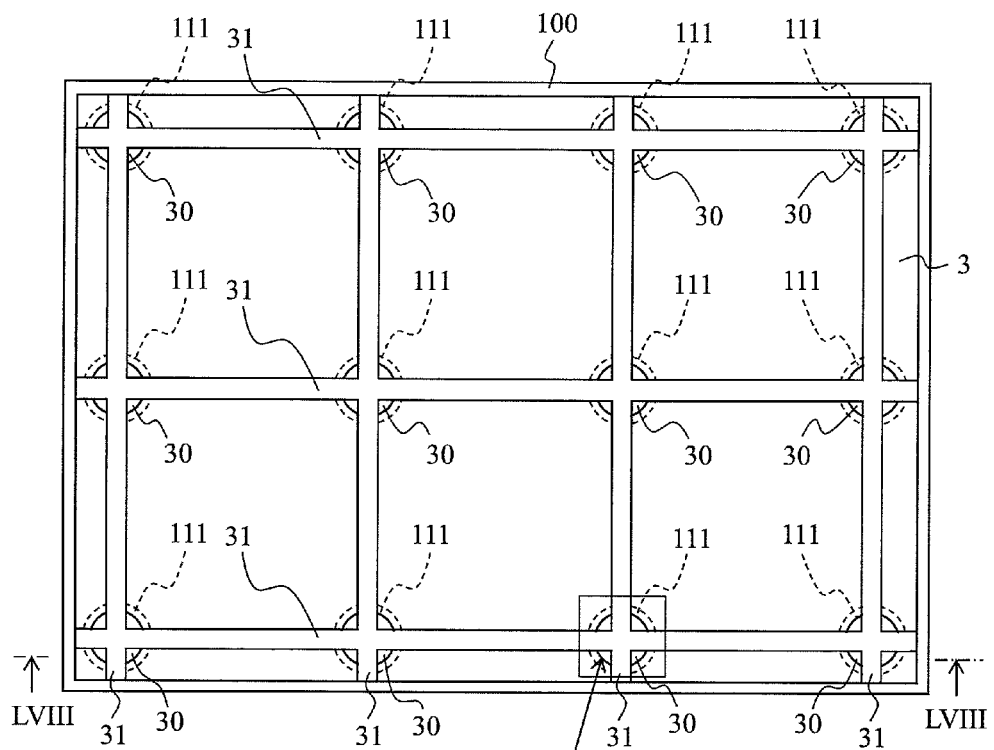
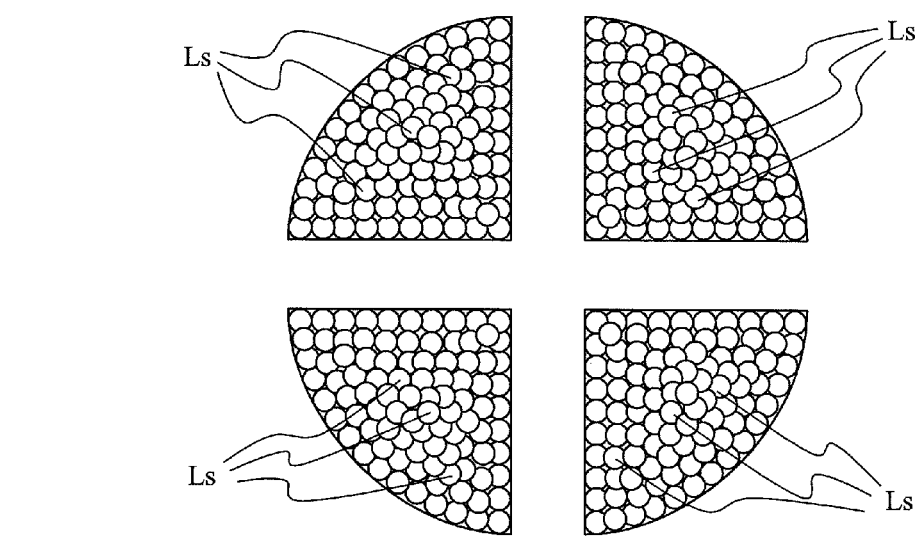

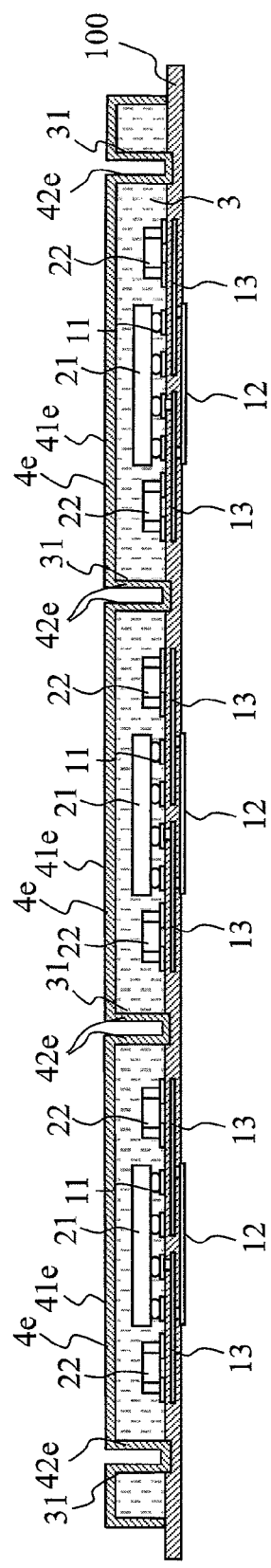
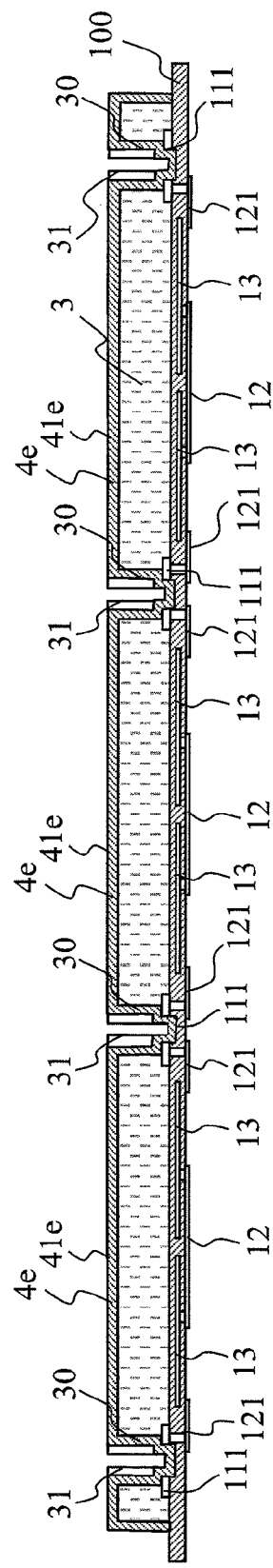

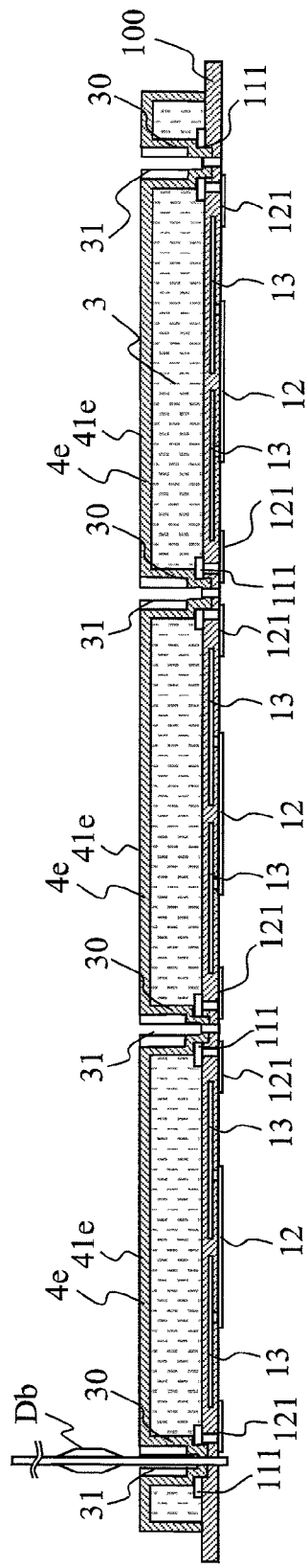

METHOD OF PRODUCING SEMICONDUCTOR MODULE AND SEMICONDUCTOR MODULE

CROSS-REFERENCE TO RELATED APPLICATIONS

This application is a Divisional of U.S. application Ser. No. 13/470,029 filed May 11, 2012, which claims priority under 35 U.S.C. §119(a) on Patent Application No. 2011-108159 filed in Japan on May 13, 2011 and Patent Application No. 2012-029803 filed in Japan on Feb. 14, 2012, the entire contents of which is hereby expressly incorporated by reference.

BACKGROUND OF THE INVENTION

1. Field of the Invention

The present invention is related to a method of producing a semiconductor module sealed with resin and a semiconductor module.

2. Description of Related Art

Semiconductor modules for electronic devices such as mobile phones conventionally have a high frequency circuit including a high frequency semiconductor device and a peripheral circuit formed therein. This requires blocking (a shield against) high frequency noise and the like, and thus, such semiconductor modules are entirely covered with a metal shield case. On the other hand, along with the recent increasing demand for compact electronic devices, there has been an increasing demand for smaller and thinner semiconductor modules.

However, in conventional semiconductor modules, pats (lands) for attaching the metal shield case need to be provided on a module substrate, which is an obstruction to achieving smaller and thinner modules.

In order to overcome the obstruction, there has been proposed an improved semiconductor module without a metal shield case (a metal-shield-case-less structure). Next, a description will be given of the improved semiconductor module with reference to the accompanying drawings. FIG. 34 is a schematic sectional view illustrating a conventional semiconductor module, and FIGS. 35 to 39 are schematic sectional views illustrating a process of producing the semiconductor module illustrated in FIG. 34.

As illustrated in FIG. 34, an improved semiconductor module G includes a module substrate 91, electronic components 92 such as a semiconductor device, a capacitor, and a resistor which are mounted on a top surface (a component-mounting surface) of the module substrate, a sealing resin layer 93 which is formed of resin such as epoxy resin and seals the electronic components 92, and an exterior shield 94 which is formed on a surface of the sealing resin layer 93.

Signal conductors 911 are formed on the component-mounting surface of the module substrate 91, and the electronic components 92 are either connected to the signal conductors 911 via bonding wires Bw or directly connected to the signal conductors 911 via terminals thereof. Inside the module substrate, there is formed a ground line 913, which includes an exposed part in its lower surface. The exterior shield 94 is formed of an electrically conductive material to cover top and side surfaces of the sealing resin layer 93. The exterior shield 94 is in contact with the ground line 913 at parts of side portions thereof facing the module substrate 91. The exterior shield 94 is grounded by being in contact with the ground line 913. In this way, it is possible to block (provide a shield against) an adverse effect (such as high frequency noise) caused by, for example, an electromagnetic field or static electricity.

The improved semiconductor module is produced in the following process. A mounting step is performed to mount the electronic components 92 on a top surface of a collective substrate 910 before it is cut into module substrates 91 (see FIG. 35). Then, by using a conventionally well-known method such as a printing method, a sealing step is performed to form the sealing resin layer 93 which seals the top surface of the collective substrate 910 with an insulating resin such as epoxy resin (see FIG. 36). Here, the collective substrate 910 has a structure such that a plurality of individual module sections (which are to be cut and divided into the module substrates 91) are arranged therein.

Then, a first dicing step is performed to form slits in the sealing resin layer 93 corresponding to boundaries between the individual module sections from the top surface side of the sealing resin layer 93 by using a dicing blade. In the first dicing step, the slits are formed in the sealing resin layer 93, and at the same time, part of the collective substrate 910 is cut off to expose part of the ground line 913 formed inside the collective substrate 910 to the top surface side (see FIG. 37).

By using a conventionally well-known method such as a printing method, electrically conductive paste is charged into the slits formed in the sealing resin layer 93 (a charging step). At this time, the electrically conductive paste charged in the slits is in contact with the ground line 913 of the collective substrate 910. Furthermore, a top surface of the sealing resin layer 93 where the slits formed therein are filled with the electrically conductive paste is coated with the electrically conductive paste (a coating step, see FIG. 38). As illustrated in FIG. 38, the electrically conductive paste is grounded by being charged in the slits and applied to coat the top surface of the sealing resin layer 93 so as to be in contact with the ground line 913. Note that the layer of electrically conductive paste serves as the exterior shield 94 of the semiconductor module G.

A second dicing step is performed to cut the collective substrate 910 at boundary parts between modules, that is, at a center part of each of the slits, which are filled with the electrically conductive paste, by using a dicing blade that is thinner than the width of the slits (a dicing blade that is thinner than the dicing blade used in the first dicing step) (see FIG. 39). Thus, since the dicing blade used in the second dicing step is thinner than the one that is used in the first dicing step, the exterior shield 94 is formed on side surfaces of the completed semiconductor module G (see FIG. 34) after the second dicing step, which makes it possible to securely ground the exterior shield 94 (see JP-A-2004-172176).

FIG. 40 is a plan view illustrating the collective substrate before being cut into the semiconductor modules in the second dicing step. A plurality of semiconductor modules G are produced by cutting the collective substrate 910, where modules are two-dimensionally arranged, by using a dicing blade (a second dicing step).

However, in producing semiconductor modules in this method, in which the slits formed in the first dicing step is filled with the electrically conductive paste, the dicing blade and the electrically conductive paste contact each other over a large area in the second dicing step. The electrically conductive paste charged in the slits contains a metal component, and this causes a heavy burden to be imposed on the dicing blade in cutting the electrically conductive paste in the second dicing step.

Besides, this leads to a high risk of defects resulting from the dicing blade rubbing off or cutting off the exterior shield, which is made of the electrically conductive paste, being exfoliated or cut off due to friction with the dicing blade. In addition, a large amount of electrically conductive paste is removed in the second dicing step. These inconveniences tend to result in low productivity and high cost.

SUMMARY OF THE INVENTION

The present invention has been made in view of the foregoing, and an object thereof is to provide a method of producing a semiconductor module which makes it possible to securely ground an external shield and to reduce a burden imposed on a dicing blade and an external seal.

Another object of the present invention is to provide a semiconductor module which is not only compact and thin but also highly producible.

To achieve the above objects, according to an aspect of the present invention, a method of producing a semiconductor module includes: a mounting step of mounting an electronic component on an individual module section of a top surface of a collective substrate; a sealing step of sealing the top surface on which the electronic component is mounted with a sealing resin layer; a hole-forming step of forming a hole extending from a top surface of the sealing resin layer to a ground wiring provided at the collective substrate; a film-forming step of forming an electrically conductive film made of an electrically conductive material so as to cover at least the top surface of the sealing resin layer, an internal surface of the hole, and the ground wiring; and a separation step of separating from each other a plurality of individual module sections which the individual module section comprises.

With this arrangement, it is possible to reduce an area over which the electrically conductive film and cutting means such as a dicing blade contact each other, and this leads to accordingly lower burden imposed on the cutting means and accordingly higher productivity. Furthermore, by forming the electrically conductive film simultaneously on the top surface of the sealing resin layer and the internal surface of the hole in the film-forming step, it is possible to securely ground the electrically conductive film, and this leads to an accordingly enhanced (shielding) property of blocking electromagnetic waves and the like.

According to a preferred embodiment of the present invention, a substrate in which the ground wiring is disposed within the individual module section may be used as the collective substrate.

This prevents a dicing blade which cuts the substrate and the like in the separation step from contacting the ground wiring, which is made of metal (and hard), and thus, it is possible to reduce not only scattering of metal pieces but also burden imposed on the dicing blade.

According to a preferred embodiment of the present invention, a substrate in which a plurality of ground wirings are provided as the ground wiring for each one of the individual module sections may be used as the collective substrate, and the hole-forming step in the preferred embodiment may form a plurality of holes that reach the ground wirings.

With this arrangement, the electrically conductive film of the produced semiconductor module is connected to the grounding wire at a plurality of positions. This makes it possible to securely ground the electrically conductive film.

According to a preferred embodiment of the present invention, a substrate in which the ground wiring is disposed at an outermost wiring layer may be used as the collective substrate.

According to a preferred embodiment of the present invention, as the collective substrate, a substrate in which solder resist is formed on the ground wiring may be used as the collective substrate, and the sealing resin layer and the solder resist may be removed from the hole in the hole-forming step.

According to a preferred embodiment of the present invention, a substrate in which the ground wiring is disposed at an internal wiring layer may be used as the collective substrate.

According to a preferred embodiment of the present invention, a substrate in which no other wiring is formed between the ground wiring and the sealing resin layer at an area in which the hole is formed may be used as the collective substrate.

To achieve the above objects, according to another aspect of the present invention, a method of producing a semiconductor module includes: a mounting step of mounting an electronic component on an individual module section of a top surface of a collective substrate; a sealing step of sealing the top surface on which the electronic component is mounted with a sealing resin layer; a hole-forming step of forming a hole penetrating the collective substrate and the sealing resin layer; a film-forming step of forming an electrically conductive film made of an electrically conductive material so as to cover a top surface of the sealing resin layer and an internal surface of the hole; and a separation step of separating from each other a plurality of individual module sections which the individual module section comprises.

According to a preferred embodiment of the present invention, the hole-forming step may form the hole such that the hole penetrates a part of the collective substrate where no wiring is formed.

According to a preferred embodiment of the present invention, the hole-forming step may form a plurality of holes as the hole such that at least one of the plurality of holes is formed on an edge of the individual module section.

According to a preferred embodiment of the present invention, the individual module section may have a rectangular shape, and the hole-forming step may form at least one of the plurality of holes at a corner of the individual module section.

According to a preferred embodiment of the present invention, the hole-forming step may form at least one of the plurality of holes across two or more of the plurality of individual module sections.

According to a preferred embodiment of the present invention, the film-forming step may form an electrically conductive film on the internal surface of the hole in such a manner that the electrically conductive material does not fill the hole.

With this arrangement, it is possible to reduce the area over which cutting means such as a dicing blade used in the separation step and the electrically conductive film contact each other, and to reduce scattering of cuttings of the electrically conductive material. It is also possible to reduce scattering of cuttings of the wirings.

According to a preferred embodiment of the present invention, there may be further included a groove-forming step of forming in the sealing resin layer a groove having a depth that does not reach the collective substrate, the groove-forming step being performed after the sealing step but before the film-forming step.

According to a preferred embodiment of the present invention, there may be further included a groove-forming step of forming in the sealing resin layer a groove that is so deep as to cut off part of the collective substrate, the groove-forming step being performed after the sealing step but before the film-forming step.

According to a preferred embodiment of the present invention, the film-forming step may form the electrically conductive film on an internal surface of the groove as well in such a manner that the electrically conductive material does not fill the groove.

With this arrangement, it is possible to reduce the area over which cutting means such as a dicing blade used in the separation step and the electrically conductive film contact each other, and to reduce scattering of cuttings of the electrically conductive material. It is also possible to reduce scattering of cuttings of the wirings.

With this arrangement, the electrically conductive film also functions to reduce inflow of moisture into the sealing resin layer, and further, by forming the electrically conductive film so deep as to cut off part of the substrate, it is possible to obtain an effect of reducing intrusion of water in the form of moisture or the like. This helps reduce a risk of cracks and the like of the resin occurring in reflow soldering.

With this arrangement, it is possible to reduce the area over which cutting means such as a dicing blade used in the separation step and the electrically conductive film contact each other, and to reduce scattering of cuttings of the electrically conductive material. It is also possible to reduce scattering of cuttings of the wirings.

Examples of the semiconductor module produced by using the methods described above include one that is provided with a plurality of independently-operating module portions.

BRIEF DESCRIPTION OF THE DRAWINGS

FIG. 7 A sectional view of the collective substrate of FIG. 6, taken along line VII-VII of FIG. 6;

FIG. 8 A sectional view of the collective substrate illustrated in FIG. 6, taken along line VIII-VIII of FIG. 6;

FIG. 9 A plan view schematically illustrating a hole-forming step;

FIG. 11 A plan view of a collective substrate in a state where a metal film is formed in a film-forming step;

FIG. 12 A sectional view of the collective substrate illustrated in FIG. 11, taken along line XII-XII of FIG. 11;

FIG. 13 A sectional view of the collective substrate illustrated in FIG. 11, taken along line XIII-XIII of FIG. 11;

FIG. 24 A plan view of a collective substrate after a film is formed thereon;

FIG. 25 A sectional view of the collective substrate illustrated in FIG. 24, taken along line XXV-XXV of FIG. 24;

FIG. 26 A sectional view of the collective substrate illustrated in FIG. 24, taken along line XXVI-XXVI of FIG. 24;

FIG. 27 A sectional view illustrating a collective substrate cut in a dicing step;

FIG. 38 A schematic sectional view illustrating a charging step performed in producing the conventional semiconductor module;

FIG. 39 A schematic diagram illustrating a second dicing step performed in producing the conventional semiconductor module;

FIG. 40 A schematic plan view illustrating a conventional collective substrate;

FIG. 57 A plan view schematically illustrating a hole-forming step;

FIG. 60 A sectional view of the collective substrate illustrated in FIG. 59, taken along line LX-LX of FIG. 59;

FIG. 61 A sectional view of the collective substrate illustrated in FIG. 59, taken along line LXI-LXI of FIG. 59; and FIG. 62 A sectional view illustrating a collective substrate after being cut in a dicing step.

DESCRIPTION OF THE PREFERRED EMBODIMENTS

Embodiments of the present invention will be described below with reference to the accompanying drawings. Reference signs for members and (or) hatching may sometimes be omitted for ease of description, and in such a case, a different drawing is to be referred to.

First Embodiment

Figure 1:
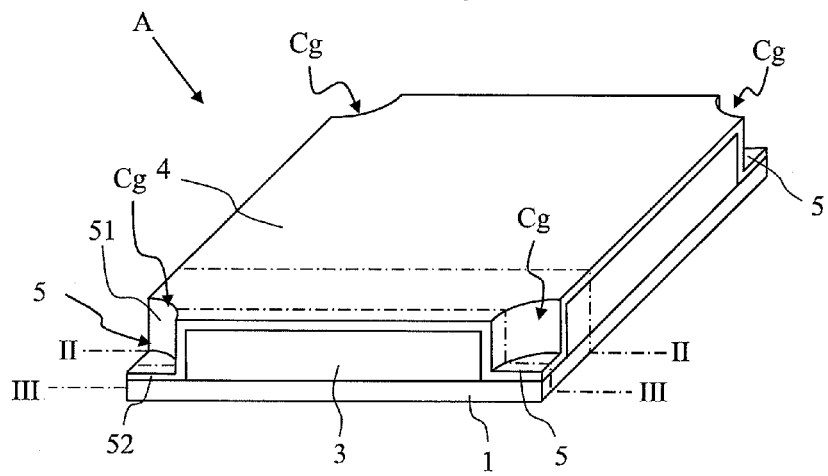
FIG. 1 A perspective view of an example of a semiconductor module according to the present invention.
Figure 2:
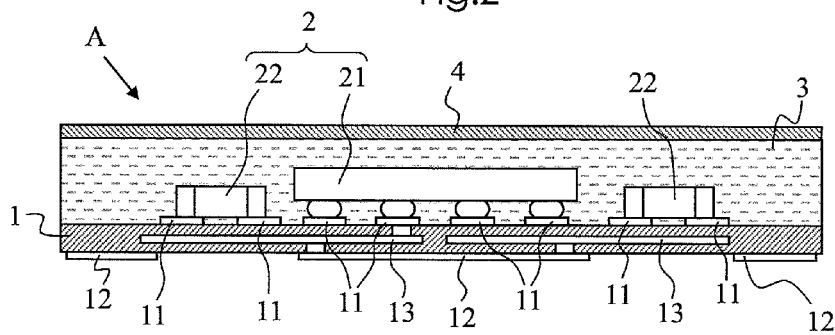
FIG. 2 A sectional view of the semiconductor module illustrated in FIG. 1, taken along line II-II of FIG. 1.
Figure 3:
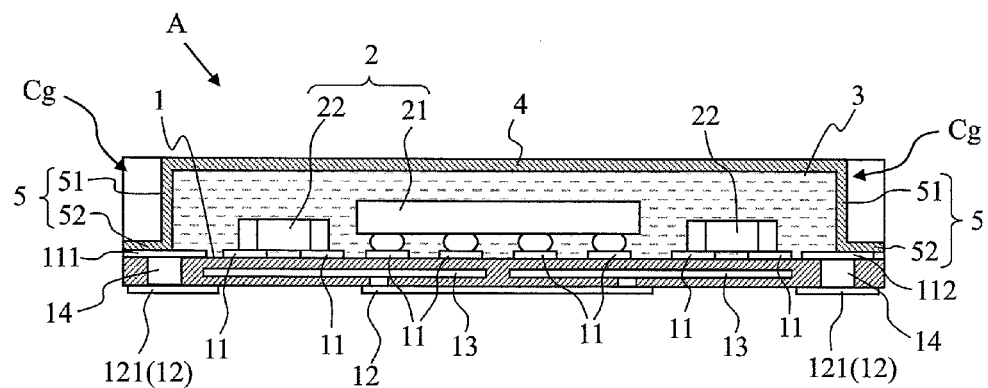
FIG. 3 A sectional view of the semiconductor module illustrated in FIG. 1, taken along line of FIG. 1.

FIG. 1 is a schematic perspective view of an example of a semiconductor module according to the present invention, FIG. 2 is a sectional view of the semiconductor module illustrated in FIG. 1, taken along line II-II of FIG. 1, and FIG. 3 is a sectional view of the semiconductor module illustrated in FIG. 1, taken along line of FIG. 1. First, with reference to FIGS. 1 to 3, a description will be given of a configuration of a semiconductor module A according to the present invention.

As illustrated in FIGS. 1 to 3, the semiconductor module A according to the present invention has a square shape as viewed from above (in plan view). The semiconductor module A includes a module substrate 1, a plurality of electronic components 2 mounted on a top surface (a main surface; may hereinafter be called a component mounting surface) of the module substrate 1, a sealing resin layer 3 which seals a top surface of the module substrate 1 including the electronic components, an exterior shield 4 which covers a top surface of the sealing resin layer 3, and connection sections 5 which are integrally formed with the exterior shield 4. The module substrate 1 is an example of a "substrate" of the present invention, and is obtained by cutting a later-described collective substrate 100. Incidentally, in the actual production process, the collective substrate 100 is cut after the electronic components are mounted and the sealing resin layer 3, the exterior shield 4, the connection sections 5, and the like are formed, and the detail of the collective substrate 100 will be described later.

The module substrate 1 is a multilayer substrate having a predetermined thickness, and it has a square shape in plan view. On a top surface of the module substrate 1, there is formed a top surface wiring 11 which is an electrically conductive film formed in a predetermined pattern to be electrically connected to terminals of the electronic components 2. Furthermore, on a bottom surface of the module substrate 1, there is formed a bottom surface wiring 12 which is also an electrically conductive film formed in a predetermined pattern. Moreover, the module substrate 1, which includes a plurality of layers, also has an inner layer wiring 13 formed between layers. Here, the top surface wiring 11, the bottom surface wiring 12, and the inner layer wiring 13 are each formed of a thin film of low-resistance metal such as copper.

The top surface wiring 11 includes a top surface ground wiring 111 which is connected to ground terminals of the electronic components 2. Likewise, the bottom surface wiring 12 includes a bottom surface ground wiring 121; when the semiconductor module A is mounted on an unillustrated mount substrate, the bottom surface ground wiring 121 is connected to a ground line of the mount substrate. The top surface ground wiring 111 and the bottom surface ground wiring 121 are connected to each other through a via hole 14; thus, when the semiconductor module A is mounted on the mount substrate, the bottom surface ground wiring 121 is grounded and the top surface ground wiring 111 is also grounded.

Note that the inner layer wiring 13 may also include a ground wiring (not illustrated). It is preferable that the ground wiring to be included in the inner layer wiring 13 be formed over as wide an area as possible of the layer where it is formed. By forming a large ground wiring in the inner layer wiring 13 in this way, it is possible to block (provide a shield against) an adverse effect (such as high frequency noise) caused by an electromagnetic field, static electricity, or the like, coming from the bottom surface side of the module substrate 1.

The top surface wiring 11, the bottom surface wiring 12, and the inner layer wiring 13 also function as wirings for transmitting electric signals. When the semiconductor module A is mounted on the mount substrate, transmission and reception of signals between a device outside the semiconductor module A and the electronic components 2 mounted on the semiconductor module A are performed via the top surface wiring 11, the bottom surface wiring 12, and the inner layer wiring 13.

As illustrated in FIG. 2, the plurality of electronic components 2 mounted on the top surface of the module substrate 1 include, for example, a semiconductor device 21 and passive components 22 such as a resistor, an inductor, and a capacitor. The plurality of electronic components 2 are appropriately selected according to aimed functions, and mounted on the component mounting surface of the module substrate 1. For example, in a case in which the semiconductor module A is used as a radio transmission/reception module for a mobile phone, an RF-IC (Radio Frequency Integrated Circuit) or the like is used as the semiconductor device 21.

The passive components 22 are chip-type electronic components (chip components). The passive components 22 are configured such that external terminal electrodes are formed on both sides of a body which is formed of, for example, burned ceramics.

The plurality of electronic components 2 described above are each mounted at a predetermined position on the top surface of the module substrate 1, and thereby, they are connected to each other or grounded via the top surface wiring 11 (see FIG. 2) of the module substrate 1. In this manner, an integrated circuit is formed in the semiconductor module A. Incidentally, in the semiconductor module A, the semiconductor device 21 which is mounted on the top surface of the module substrate 1 is an IC formed in a WL-CSP (Wafer Level Chip Size Package). Furthermore, in some cases, a component such as a BPF (Band Pass Filter) or a crystal oscillator is also mounted on the module substrate 1 as necessary.

The top surface of the module substrate 1 on which the electronic components 2 are mounted is, as already described above, covered with the sealing resin layer 3, together with the electronic components 2. The sealing resin layer 3, which seals the electronic components 2 and serves as an insulating layer, is formed to cover the entire top surface of the module substrate 1. The sealing resin layer 3 protects the electronic components 2 and the top surface wiring 11 from external stress, moisture, and contaminants. The sealing resin layer 3 is formed of an insulating resin such as epoxy resin. Note that this does not limit the composition of the sealing resin layer 3, and a material can be adopted from a wide variety of resins or the like as long as it is capable of sealing the top surface of the module substrate 1 and the electronic components 2.

In the semiconductor module A, there are formed grooves Cg, each being sector-shaped in section, at four corners of the semiconductor module A, the grooves Cg extending from a top surface to a bottom surface of the semiconductor module A. The grooves Cg, starting from the top surface of the semiconductor module A, penetrate the sealing resin layer 3, and reach the top surface of the module substrate 1.

And, an external shield 4 is formed so as to cover the top surface of the sealing resin layer 3. The external shield 4 is an electrically conductive metal film made of, for example, copper, nickel, or the like. In the semiconductor module A, the exterior shield 4 completely covers the top surface of the sealing resin layer 3, and is firmly fixed to the sealing resin layer 3. Furthermore, connection sections 5 are provided inside the grooves Cg; the connection sections 5 are formed of the same metal film as the exterior shield 4 to be integral (electrically connected) with the exterior shield 4.

Each of the connection sections 5 includes an internal circumference portion 51 which is so arranged as to cover an internal circumference surface of a corresponding one of the grooves Cg, and a contact portion 52 which is formed at an end of an internal circumference part that is opposite from another end of the internal circumference part at the exterior shield 4 side and which is electrically connected to a top surface ground wiring 111 formed on the top surface of the module substrate 1. Since a connection section 5 is electrically connected to the top surface ground wiring 111, the exterior shield 4 that is formed integral with the connection sections 5 (the internal circumference portions 51) is also electrically connected to the top surface ground wiring 111. Here, as illustrated in FIG. 3, the top surface ground wiring 111 is connected, through a via hole 14, to a bottom surface ground wiring 121 formed on the bottom surface of the module substrate 1. And, by the bottom surface ground wiring 121 being grounded (for example, by being connected to a ground line of the mount substrate), the exterior shield 4 is also grounded.

This allows the exterior shield 4 to function as an electromagnetic shield to block (provide a shield against) an adverse effect (such as high frequency noise) caused by an electromagnetic field or static electricity. Here, side surfaces of the semiconductor module A are not covered with the exterior shield 4, but the semiconductor module A is thin enough for the exterior shield 4 (which does not cover the side surfaces) to exert a satisfactory shielding effect.

Besides, in the semiconductor module A, one of the contact portions 52 is in contact with the top surface ground wiring 111 disposed on the top surface of the module substrate 1. The top surface ground wiring 111 and the contact portion 52 are both formed in a flat shape, and this allows the top surface ground wiring 111 and the contact portion 52 to be in contact with each other over a large area. This makes it possible to ensure grounding of the exterior shield 4.

A top surface ground wiring may be formed to be positioned inward from an edge of the module substrate 1, like a top surface ground wiring 112 which is connected to another connection section 5 on the right side of FIG. 3. Features related to, and effects of, the top surface ground wiring 112 will be dealt with in descriptions of production methods which will be given later. Note that, although the semiconductor module A has the connection sections 5 formed at its four corners, this is not meant as limitation and the connection sections 5 may be formed wherever and in whatever manner as long as the external shield 4 can be securely shielded. For example, the connection sections 5 may be formed at least one of the four corners, or may be formed at a position or positions other than the four corners.

Next, a description will be given of a method of producing the semiconductor module A of the present invention, with reference to appropriate drawings. FIGS. 4 to 16 are diagrams schematically illustrating steps performed in producing the semiconductor module A.

Figure 4:
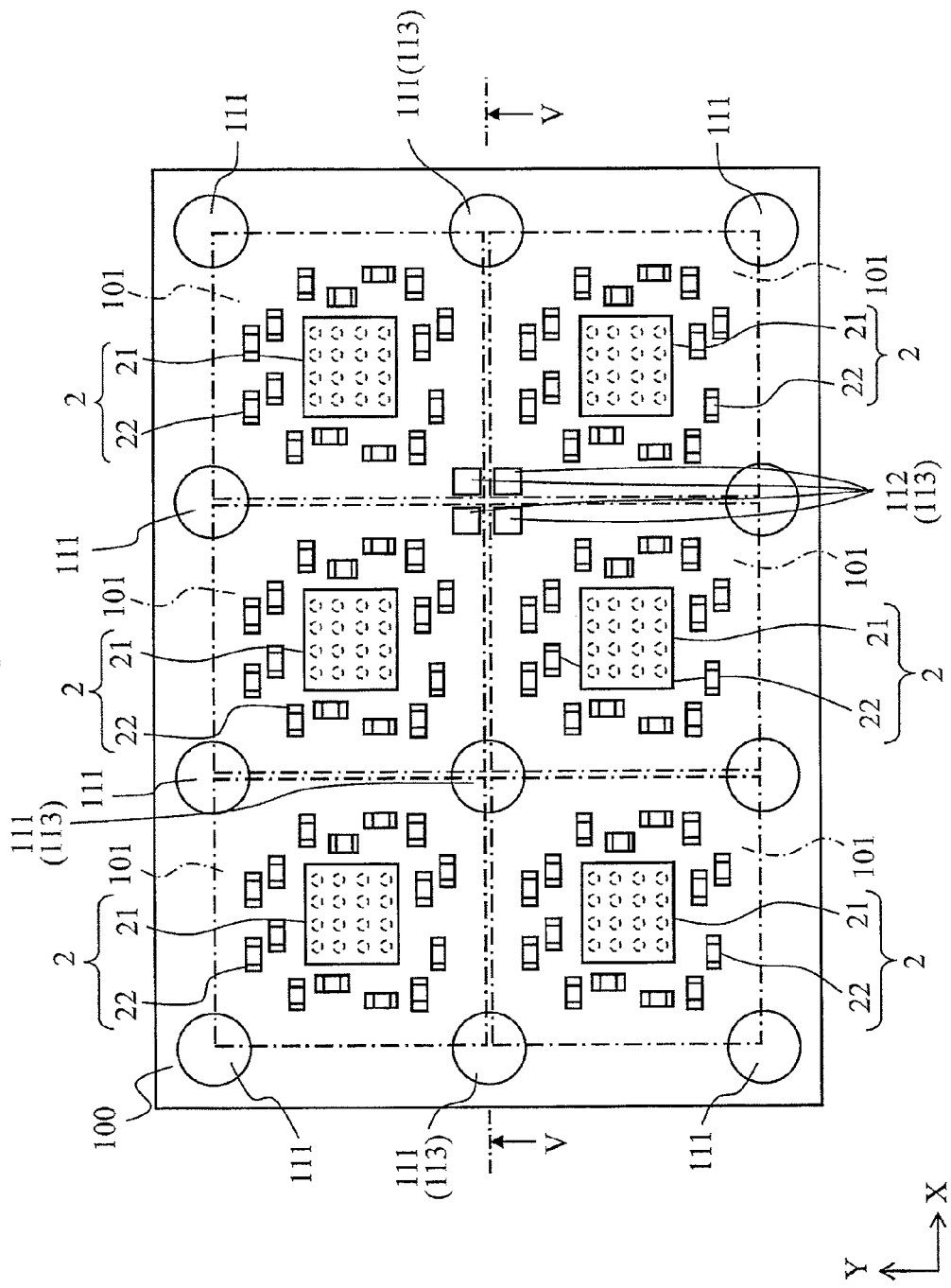
FIG. 4 A plan view illustrating a state where electronic components are mounted on a collective substrate.
Figure 5:
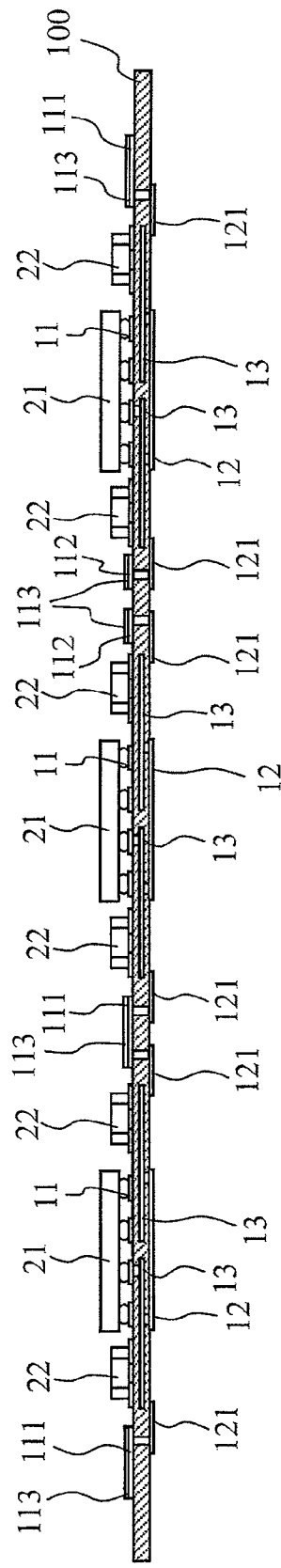
FIG. 5 A sectional view of the collective substrate illustrated in FIG. 4 taken along line V-V of FIG. 4.

FIG. 4 is a plan view illustrating a state where electronic components are mounted on a collective substrate, and FIG. 5 is a sectional view of the collective substrate illustrated in FIG. 4. Although the top surface wiring 11, which is a wiring pattern, is not illustrated in FIG. 4, it is actually assumed that the top surface wiring 11 is equally formed in each of portions of the collective substrate 100 which each are a module substrate 1. In FIG. 4, a horizontal direction will be called direction X, and a direction perpendicular to direction X in the sheet will be called direction Y. Also, in the collective substrate 100 in FIG. 4, among the top surface wirings 11, only the top surface ground wirings used as ground lines are illustrated for the sake of convenience.

First, the collective substrate 100, having a shape where module substrates 1 are arranged and combined, is prepared. The collective substrate 100 is a multilayer substrate, and the collective substrate 100 includes a plurality of individual module sections 101 which are equivalent in shape and size. Here, in FIG. 4, in order to define each of the individual module sections 101, boundaries are indicated by alternate dash and dot lines (boundary lines); however, in the actual collective substrate 100, no boundary lines are formed between the individual module sections 101.

Here, the individual module sections 101 are portions to be separated from each other into module substrates 1, and square in shape. Later, in a dicing step, the collective substrate 100 is divided along dicing lines (not illustrated) provided between the individual module sections 101 in directions X and Y, the individual module sections 101 are separated from each other into the module substrates 1. Note that the dicing lines may be actually formed on the collective substrate 100, or may be virtual lines stored in a control section of a dicer as positional information (of coordinates, length, and the like).

The collective substrate 100 includes top surface wirings 11, bottom surface wirings 12 and internal layer wirings 13. Here, the top surface wirings 11, the bottom surface wirings 12, and the internal layer wirings 13 are respectively common in shape and size in all the individual module sections 101.

As illustrated in FIGS. 4 and 5, on the top surface (the component mounting surface) of the collective substrate 100, which has a shape such that module substrates 1 are arranged and combined, the plurality of electronic components 2 such as the semiconductor devices 21 and the passive components 22 are mounted by soldering (a mounting step). The top surface wirings 11 are formed of a plurality of wiring patterns, and the terminals of the plurality of electronic components 2 are mounted to be each connected to a predetermined one of the top surface wirings 11. The top surface ground wirings 111 are formed to partly overlap the individual module sections 101. A detailed description will now be given of the top surface ground wirings 111.

As illustrated in FIG. 4, the top surface ground wirings 111 are circular in shape in plan view, and the top surface ground wirings 111 are arranged such that there is one top surface ground wiring 111 at each corner of the individual module sections 101. In the collective substrate 100, the individual module sections 101 are two-dimensionally arranged and evenly spaced from each other, and thus, the top surface ground wirings 111 are formed one at each of positions where corners of the individual module sections 101 gather. Here, each parts where a top surface ground wiring 111 and an individual module section 101 overlap each other is sector-shaped. The collective substrate 100 is cut, in the later-described dicing step, in a state in which the top surface ground wirings 111 are arranged therein, leaving top surface ground wirings 111 having a shape of a sector in plan view at the four corners of each of the module substrates 1.

Among the top surface ground wirings arranged on the collective substrate 100, the second one from the right in the central row in the figure may be replaced by top surface ground wirings 112 which are each separately formed inside a corner of a corresponding one of the individual module sections 101. Note that the collective substrate 100 may include both the top surface ground wirings 111 and the top surface ground wirings 112 as illustrated in FIG. 4, or instead, the collective substrate 100 may include only either the top surface ground wirings 111 or the top surface ground wirings 112.

In the semiconductor module A, where the electronic components 2 are surface-mounted, electronic components are mounted in the following procedure, for example. First, by using a printing method, cream solder is applied to the top surface wirings 11 formed on the top surface of the collective substrate 100. Then, by using a mounter, the plurality of electronic components 2 (the semiconductor devices 21 and the passive components 22) are arranged such that each terminal thereof is connected to a predetermined one of the top surface wirings 11. Then, the collective substrate 100 where the electronic components 2 are arranged is heated in a reflow oven to melt the solder, and thereby, the electronic components 2 are fixed to the top surface wirings 11. Here, solder resist 113 may be formed at the top surface ground wirings 111 and 112 so as to reduce the top surface ground wirings 111 or the top surface ground wirings 112 from being oxidized in the process of reflow soldering. The same effect can also be acquired by placing ground wirings in an internal layer.

Figure 6:
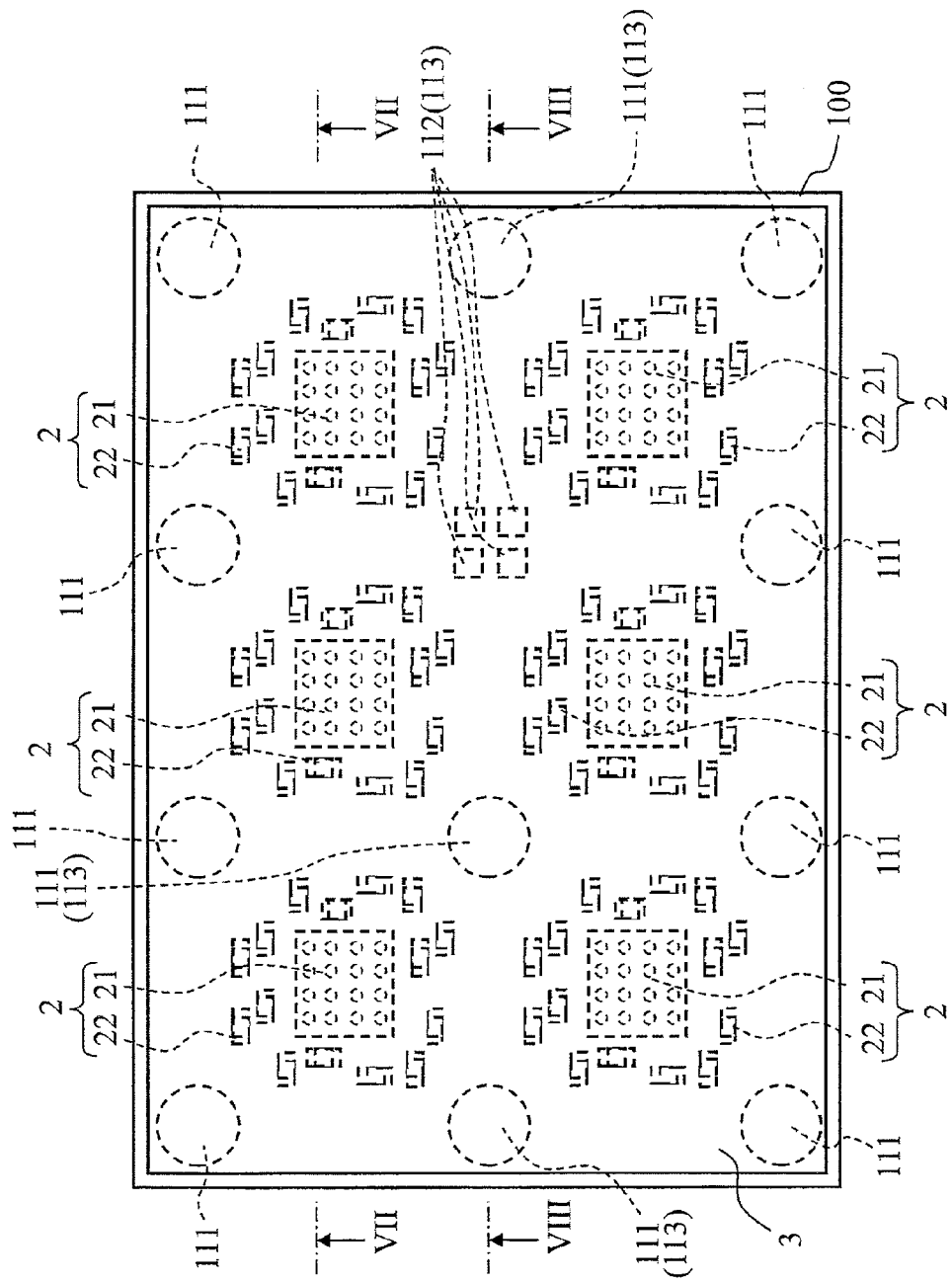
FIG. 6 A plan view illustrating a collective substrate after a sealing step.

The sealing resin layer 3, which is formed of insulating resin, is formed on the top surface of the collective substrate 100, where the plurality of electronic components 2 are mounted in the mounting step (a sealing step). FIG. 6 is a plan view illustrating the collective substrate after the sealing step, FIG. 7 is a sectional view of the collective substrate illustrated in FIG. 6, taken along line VII-VII of FIG. 6, and FIG. 8 is a sectional view of the collective substrate illustrated in FIG. 6, taken along line VIII-VIII of FIG. 6.

As illustrated in FIG. 6, on the top surface of the collective substrate 100 where the electronic components 2 are mounted, the sealing resin layer 3 of an insulating resin is formed by, for example, a transfer mold method. An example of the insulating resin used in the sealing step is epoxy resin. The epoxy resin, which is a thermosetting resin, is put to cover the top surface of the collective substrate 100, and is then heated to be set. In some cases, inorganic filler is added to adjust the fluidity (viscosity) of the epoxy resin. As illustrated in FIG. 6, the sealing resin layer 3 completely covers the top surface of the collective substrate 100. In the transfer mold method, a die (for example, metal or carbon) is attached to the collective substrate 100, and epoxy resin is charged into the die. By applying heat to the die in this state, the epoxy resin is heated. The epoxy resin, which is a thermosetting resin, is set by receiving heat from the die.

Figure 10:
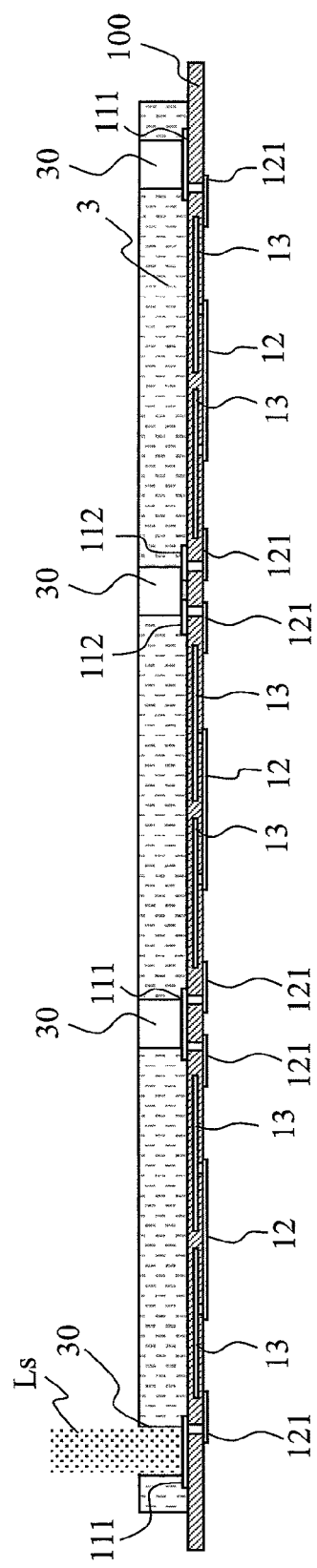
FIG. 10 A sectional view of a collective substrate after the hole-forming step illustrated in FIG. 9.

After the sealing step, holes 30, which are each circular shaped in section, are formed in the sealing resin layer 3 of the collective substrate 100 (a hole-forming step). FIG. 9 is a plan view schematically illustrating the hole-forming step, and FIG. 10 is a sectional view illustrating the collective substrate after the hole-forming step illustrated in FIG. 9. In the hole-forming step, laser light Ls is applied to predetermined parts to thereby form the holes 30 at positions in the sealing resin layer 3 over the top surface ground wirings 111 and the top surface ground wirings 112. Here, an unillustrated processing machine forms the holes 30 by applying the laser light Ls to parts of the sealing resin layer 3 over the top surface ground wirings 111 based on values of X and Y coordinates of the positions where the holes 30 are to be formed (where the laser light Ls is to be applied).

Note that the holes 30 are cylinder-shaped holes having an inner diameter that is smaller than the external diameter of the circular-shaped top surface ground wirings 111, and bottom ends of the holes 30 reach the top surface ground wirings 111. That is, by forming the holes 30, parts of the sealing resin layer 3 over the top surface ground wirings 111 are removed. The holes 30 are formed by using the laser light Ls, but this is not meant as a imitation, and the holes 30 may be mechanically formed by using a machine such as a drill, or can be formed by using, for example, an etching method. Any method other than these methods may be adopted as long as the holes 30 can be shaped accurately. One of the holes 30 that is formed over the top surface ground wirings 112 is shaped and sized such that it fits inside a square formed by outer sides of the four top surface ground wirings 112.

In a case in which solder resist 113 is formed at the top surface ground wirings 111 and the top surface ground wirings 112, it is possible to ensure electric connection between the top surface ground wirings 111 and the contact portions 52 of the connection sections 5 by removing the solder resist after the sealing resin layer 3 is formed in the sealing step. As to how to remove the solder resist 113, it is possible to remove the solder resist 113 simultaneously as the sealing resin layer 3 is removed by using laser light in the hole-forming step.

As illustrated in FIG. 9, the holes 30 are formed at positions where corners of the individual module sections 101 are located, that is, parts where dicing lines cross each other. Thus, by forming one hole 30, a groove Cg can be formed at a corner of each of four individual module sections 101, and this helps achieve a high production efficiency. It should be noted that the holes 30 do not necessarily need to be formed at the positions where the dicing lines cross each other, but instead, they may each be formed to be within a corresponding one of the individual module sections 101, or alternatively, they may each be formed to lie across a boundary between corresponding two of the individual module sections 101. It should also be noted that, although the holes 30 are assumed to be circular in section here, it is not meant as a limitation, and they may be oval in section, or alternatively, they may be polygonal, for example, square, rhombic or the like, in section.

After the holes 30 are formed in the hole-forming step, a metal film is formed on the top surface of the sealing resin layer 3 (a film-forming step). FIG. 11 is a plan view illustrating the collective substrate after the metal film is formed thereon in the film-forming step, FIG. 12 is a sectional view illustrating the collective substrate illustrated in FIG. 11 taken along line XII-XII of FIG. 11, and FIG. 13 is a sectional view illustrating the collective substrate illustrated in FIG. 11 taken along line XIII-XIII of FIG. 11. As illustrated in FIGS. 11 to 13, on the top surface of the collective substrate 100 where the sealing resin layer 3 is formed and then the holes 30 are formed, that is, on the top surface of the sealing resin layer 3, the metal film is formed by a plating method. The metal film formed in the film-forming step completely covers the top surface of the sealing resin layer 3 in a uniform or substantially uniform manner.

In the film-forming step, the metal film is formed not only on the top surface of the sealing resin layer 3 but also on internal circumference surfaces of the holes 30 (see FIG. 13). Furthermore, the metal film is formed on bottom surfaces of the holes 30 as well. That is, some parts of the metal film formed in the film-forming step are on the bottom and internal circumference surfaces of the holes 30, and the parts of the metal film on the bottom surfaces of the holes 30 are in contact with the top surface ground wirings 111 and 112. The metal film formed in the film-forming step forms the exterior shield 4 and the connection sections 5 illustrated, for example, in FIGS. 1 and 3.

As illustrated in FIGS. 12 and 13, the exterior shield 4 covers the top surface of the sealing resin layer 3, that is, the top surfaces of the module substrates 1 (or the collective substrate 100 before the dicing step) on which the electronic components 2 are mounted. And, the exterior shield 4 is electrically connected to the top surface ground wirings 111 and 112 via the internal circumference portions 51 and the contact portions 52 of the connection sections 5 formed in the holes 30. The top surface ground wirings 111 and 112 are electrically connected to the bottom surface ground wirings 121 through the via holes 14, and thus, for example, when the individual semiconductor module A is mounted on the mount substrate, the bottom surface ground wirings 121 are grounded, and the top surface ground wiring 111 which is connected to the bottom surface ground wiring 121, and the exterior shield 4 which is connected to the top surface ground wiring 112 is also grounded. Preferably, the exterior shield 4 is formed of a low-resistance metal such as copper.

Figure 14:
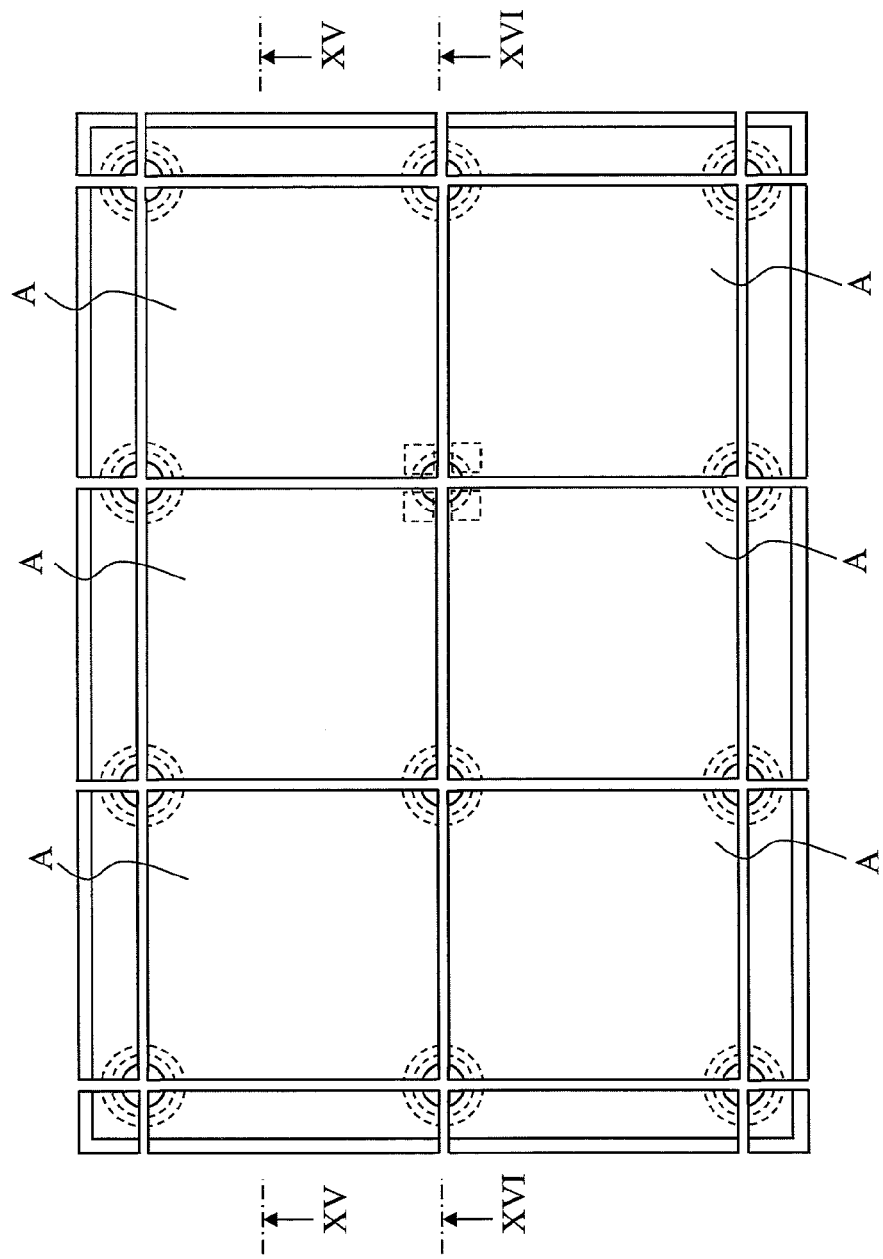
FIG. 14 A plan view illustrating a collective substrate cut in a dicing step.
Figure 15:
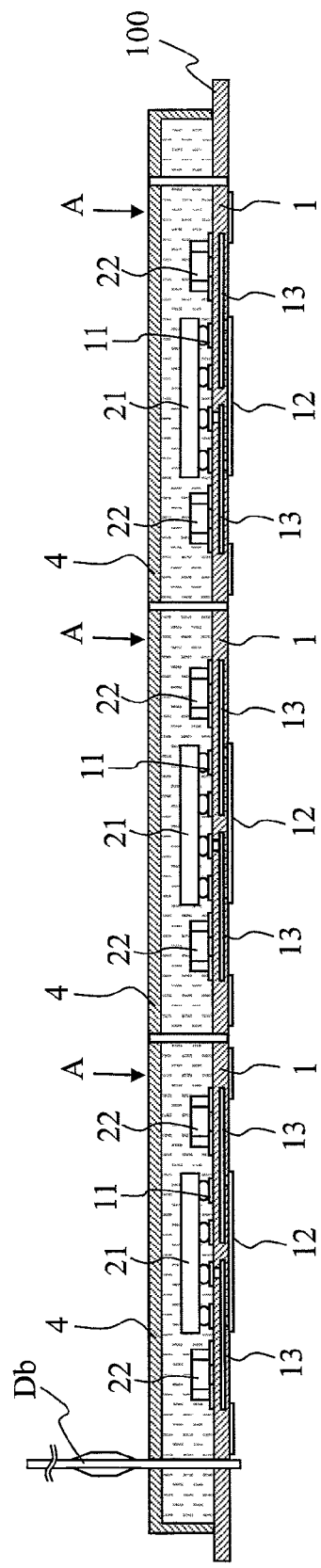
FIG. 15 A sectional view of the collective substrate illustrated in FIG. 14, taken along line XV-XV of FIG. 14.
Figure 16:
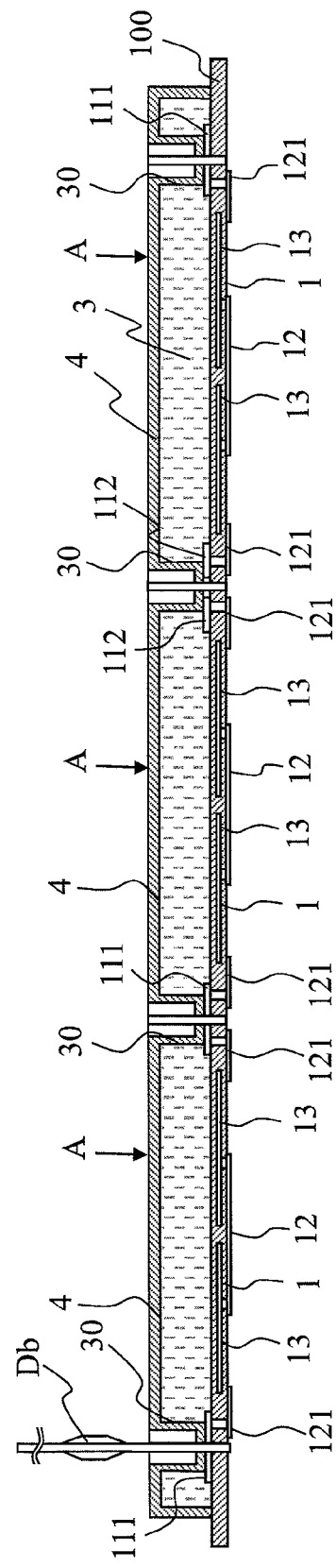
FIG. 16 A sectional view of the collective substrate illustrated in FIG. 14, taken along line XVI-XVI of FIG. 14.

The collective substrate 100 where the exterior shield 4 and the connection sections 5 are formed in the film-forming step is cut and separated (a dicing step: a separation step). FIG. 14 is a plan view illustrating the collective substrate cut in the dicing step, FIG. 15 is a sectional view of the collective substrate illustrated in FIG. 14 taken along line XV-XV of FIG. 14, and FIG. 16 is a sectional view of the collective substrate illustrated in FIG. 14 taken along line XVI-XVI of FIG. 14. In the dicing step, by moving a dicing blade Db, which rotates at a high speed, along dicing lines formed at boundary parts between the individual module sections 101, the individual module sections 101 are divided and separated from each other as individual semiconductor modules A.

Specifically, in the dicing step, a plurality of circular top surface ground wirings 111 formed on the top surface of the collective substrate 100 are each divided into four equal parts. For this purpose, lines (the dicing lines) along which the dicing blade Db moves in the dicing step are each set to extend either in direction X or direction Y to pass the center between two adjacent top surface ground wirings 111. By setting the dicing lines in this manner and by moving the rotating dicing blade Db along the dicing lines, it is possible to obtain the individual semiconductor modules A, each having one top surface ground wiring 111 formed sector-shaped in plan view at each of the four corners thereof.

In each of the semiconductor modules A formed through the plurality of steps, side surfaces are cut surfaces resulting from being cut by the dicing blade Db. Thus, in the dicing step, it is possible to reduce an area over which the metal film (the exterior shield 4) and the dicing blade contact with each other. This makes it possible to reduce the risk of inconvenience such as abrasion and chipping of the external shield occurring due to friction between the metal film and the dicing blade. Furthermore, by reducing the area over which the metal film (the exterior shield 4) and the dicing blade contact with each other, it is possible to reduce the risk of a heavy burden being imposed on the dicing blade, and thus to prolong the life of the dicing blade, which accordingly helps enhance the productivity in producing the semiconductor modules.

Moreover, the top surface ground wirings 112 are disposed inside the individual module sections 101, and thus are not cut by the dicing blade Db in the dicing step. This helps reduce the burden imposed on the dicing blade Db.

In addition, since the connection sections 5 are formed in the grooves Cg, which are formed in the side surfaces of the sealing resin layer 3, and the exterior shield 4 is connected via the connection sections 5 to the top surface ground wirings 111 or the top surface ground wirings 112 of the module substrate 1, it is possible to achieve thinner and more compact semiconductor modules in comparison with ones where a case is used. Besides, since the contact portions 52 of the connection sections 5 are each in surface contact with a corresponding one of the top surface ground wirings 111, the contact is prevented from becoming unstable. Furthermore, since the connection sections 5 are formed in all of the four corners of each of the individual module sections 101, it is possible to ensure the grounding of the external shield 4, and thus to enhance the effect of blocking (providing a shield against) an adverse effect (such as high frequency noise) caused by an electromagnetic field, static electricity, and the like.

Thus, the semiconductor module A of the present invention, which is compact and thin and also can be produced with less material, can be produced with high productivity.

Second Embodiment

Figure 17:
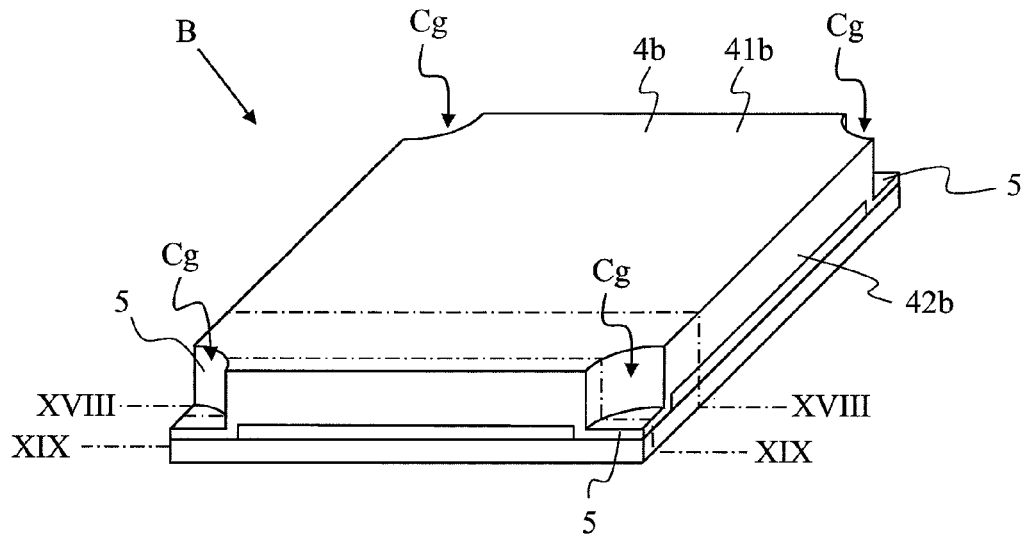
FIG. 17 A perspective view of another example of the semiconductor module according to the present invention.
Figure 18:
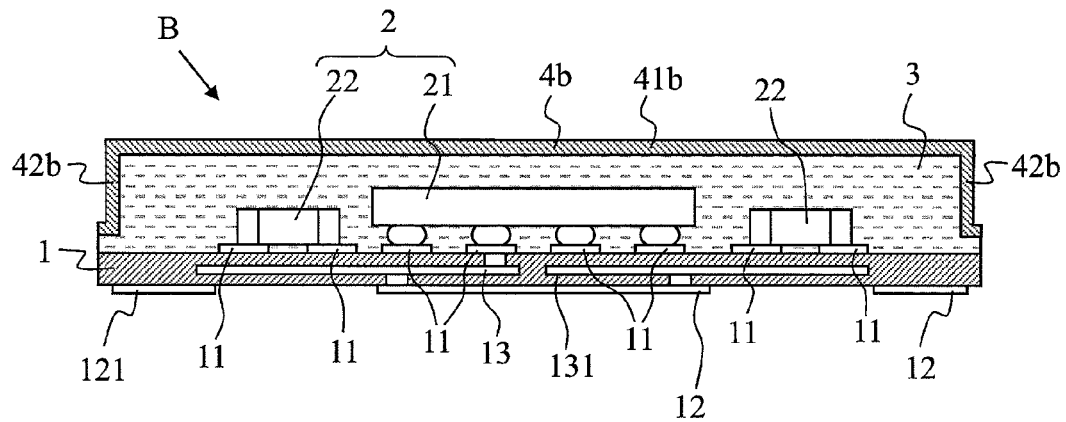
FIG. 18 A sectional view of the semiconductor module illustrated in FIG. 17, taken along ling XVIII-XVIII of FIG. 17.
Figure 19:
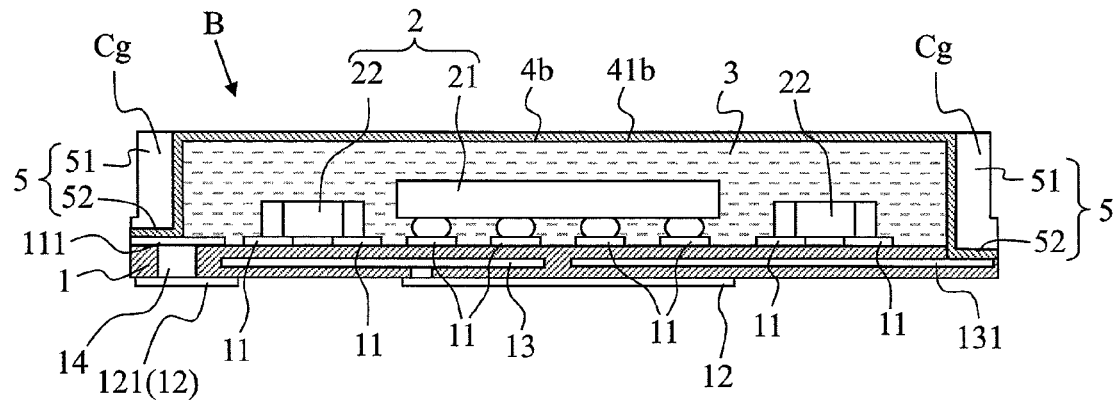
FIG. 19 A sectional view of the semiconductor module illustrated in FIG. 17, taken along ling XIX-XIX of FIG. 17.

A description will be given of another example of the semiconductor module of the present invention, with reference to the accompanying drawings. FIG. 17 is a perspective view of another example of the semiconductor module according to the present invention, FIG. 18 is a sectional view illustrating the semiconductor module illustrated in FIG. 17 taken along line XVIII-XVIII of FIG. 17, and FIG. 19 is a sectional view illustrating the semiconductor module illustrated in FIG. 17 taken along line XIX-XIX of FIG. 17. Note that the semiconductor module B illustrated in the figures has the same configuration as the semiconductor module A except that an exterior shield 4b and a connection section 5 that is illustrated on the right side in FIG. 19 is connected to a ground wiring (an internal layer ground wiring 131) included in internal wirings 13 formed in a module substrate 1. Among parts forming the semiconductor module B, those substantially the same as their counterparts forming the semiconductor module A are identified with common symbols and their detailed descriptions will be omitted.

As illustrated in FIG. 17, the exterior shield 4b includes a top surface shield 41b which covers a top surface of a sealing resin layer 3 and side surface shields 42b which cover side surfaces of the sealing resin layer 3. In more detail, the top surface shield 41b has the same shape as the exterior shield 4 of the semiconductor module A, that is, the top surface shield 41b is a square-shaped plate member having sector-shaped cuts formed at four corners thereof. As illustrated in the figures, the side surface shields 42b are rectangular plate members formed to cover the side surfaces of the sealing resin layer 3 such that two ends thereof in the length direction thereof are each connected to a corresponding one of connection sections 5. The side surface shields 42b are also connected to the top surface shield 41b at one of long sides thereof (see FIGS. 17 and 18). Here, in the exterior shield 4b illustrated in the figures, the top surface shield 41b and the side surface shields 42b are integrally formed with each other. Likewise, the side surface shields 42b and the connection sections 5 are also integrally formed with each other.

In the semiconductor module B, as in the semiconductor module A, the connection sections 5 are electrically connected to top surface ground wirings 111 formed on a top surface of a module substrate 1. Thereby, the exterior shield 4b is grounded, that is, the top surface shield 41b and the side surface shields 42b are grounded. This makes it possible to improve the effect of the exterior shield 4b to block (provide a shield against) an adverse effect (such as high frequency noise) caused by an electromagnetic field or static electricity. Furthermore, since the sealing resin layer 3 made of an insulating layer is disposed between the module substrate 1 and the side surface shields 42b, it is possible, in soldering the semiconductor module to a mount substrate (not illustrated), to reduce the solder from coming in contact with the side surface shields 42b, and thus to reduce short-circuit of circuits.

Also, as illustrated in FIG. 19, the connection sections 5 are connected to a grounded wiring (an internal layer ground wiring 131) included in internal layer wirings 13 of the module substrate 1. Typical multilayer substrates often include a large-area internal layer ground wiring 131. By connecting a connection section 5 to the internal layer ground wiring 131, the exterior shield 4 can be connected to a large-area ground wiring with the shortest distance therebetween, and this helps enhance the shield effect of the exterior shield 4b. Furthermore, since it is also possible to omit a top surface ground wiring 111, it is possible to reduce the size of the semiconductor module B.

Incidentally, in FIG. 19, only the connection section 5 on the right is connected to the internal layer ground wiring 131, but this is not meant as a limitation, and the connection sections 5 at all of the four corners may be connected to the internal layer ground wiring 131, or, the connection sections 5 at all of the four corners may be connected to the top surface ground wiring 111. Alternatively, there may be provided at least one connection section 5 that is connected to the internal layer ground wiring 131 and at least one connection section 5 that is connected to the top surface ground wiring 111. Still alternatively, a connection section 5 may be connected to a bottom surface ground wiring 121.

Next, a description will be given of a process of producing the semiconductor module B illustrated in FIG. 17, with reference to appropriate drawings. FIGS. 20 to 26 are diagrams schematically illustrating part of the process of producing a semiconductor module illustrated in FIG. 12. Steps in the process of producing the semiconductor module B are the same as those of producing the semiconductor module A until the mounting step and the sealing step. That is, a plurality of electronic components 2 are mounted on a top surface of a collective substrate 100, and then the top surface of the collective substrate 100 is sealed with an insulating resin.

Figure 20:
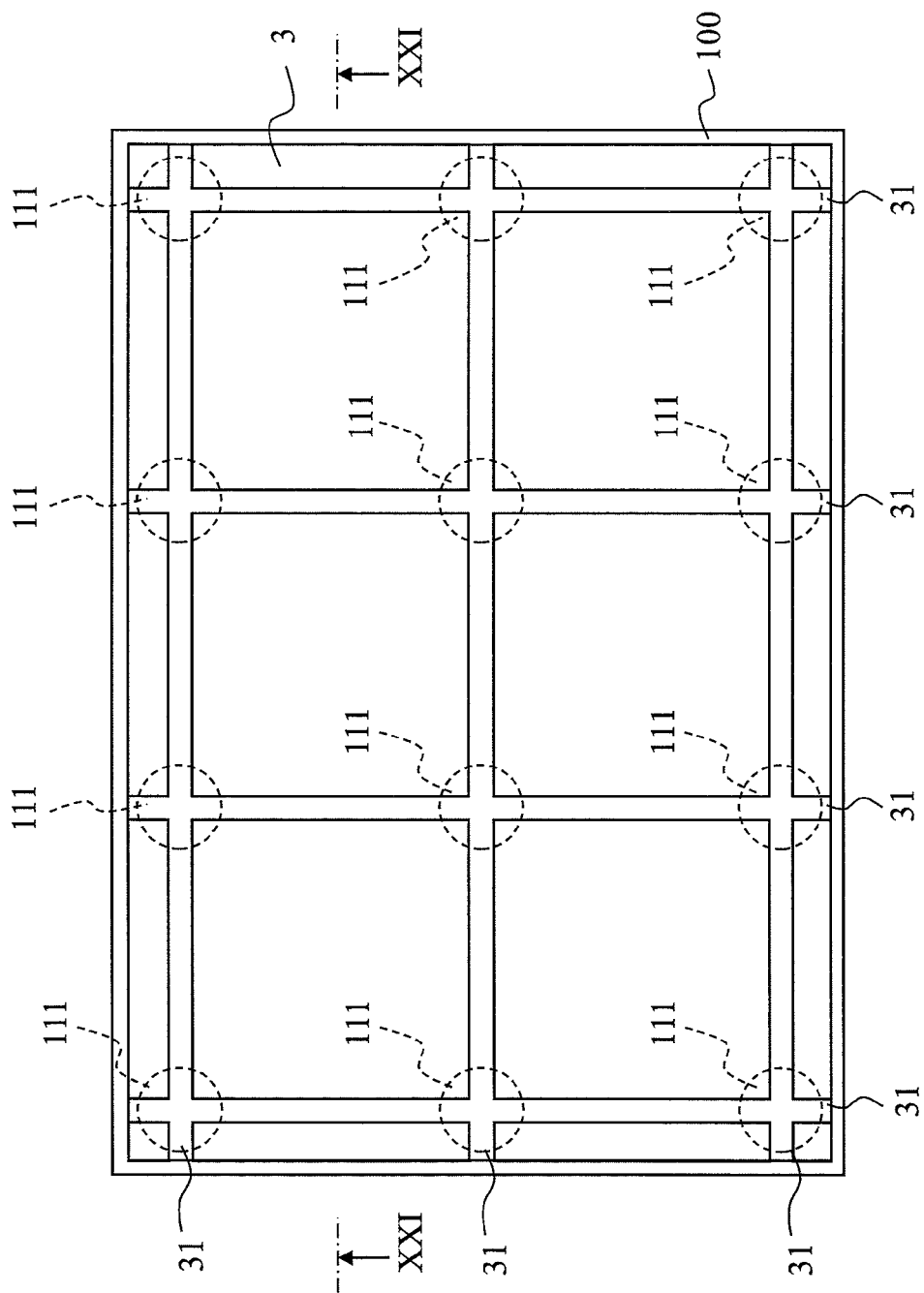
FIG. 20 A plan view of a collective substrate in which grooves are formed in a surface of a sealing resin after a sealing step.
Figure 21:
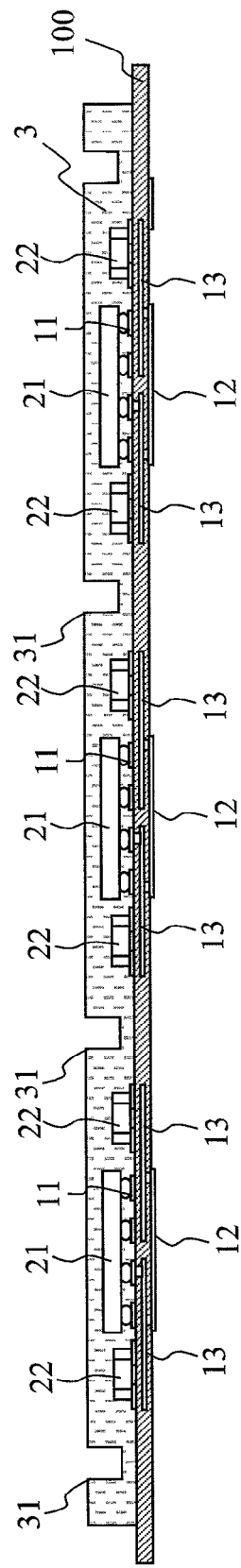
FIG. 21 A sectional view of the collective substrate illustrated in FIG. 20, taken along line XXI-XXI of FIG. 20.

FIG. 20 is a plan view of a collective substrate in which grooves are formed in a surface of a sealing resin after the sealing step, and FIG. 21 is a sectional view illustrating the collective substrate illustrated in FIG. 20 taken along line XXI-XXI of FIG. 20. After a sealing resin layer 3 is formed on the top surface of the collective substrate 100 in the sealing step (see FIG. 6), linear grooves 31 are formed in a top surface of the sealing resin layer 3 to be laid through adjacent top surface ground wirings 111. As illustrated in FIG. 21, a depth of the grooves 31 is not larger than a thickness of the sealing resin layer 3 in an up-down direction, that is, the depth is set such that bottom surfaces of the grooves 31 do not reach the collective substrate 100. With this configuration, it is possible to prevent top surface wirings 11 formed on the top surface of the collective substrate 100 from being exposed from the grooves 31. This helps prevent a metal film formed in a later-described film-forming step from being electrically connected to the top surface wirings 11.

Figure 22:
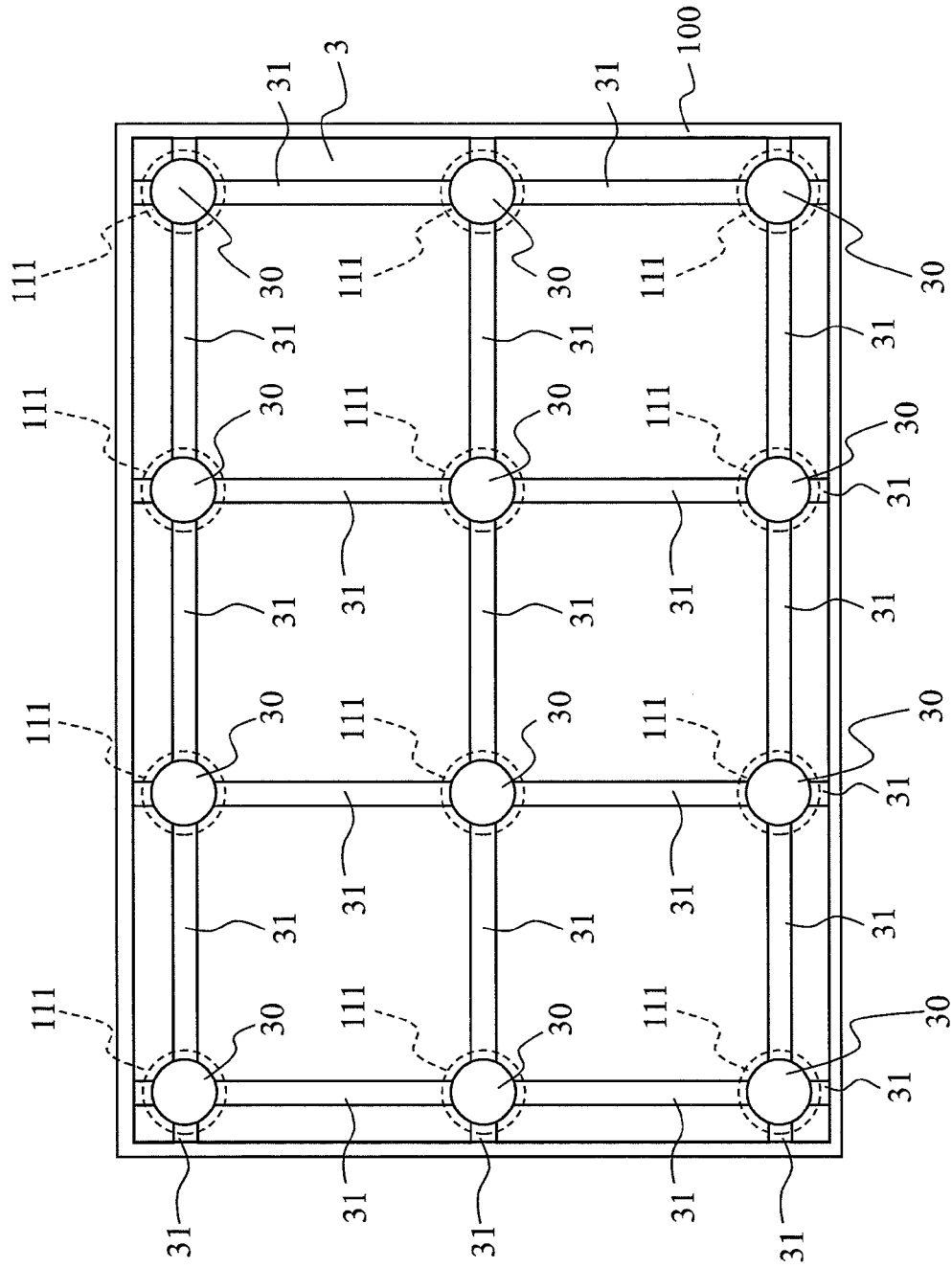
FIG. 22 A plan view schematically illustrating a hole-forming step.
Figure 23:
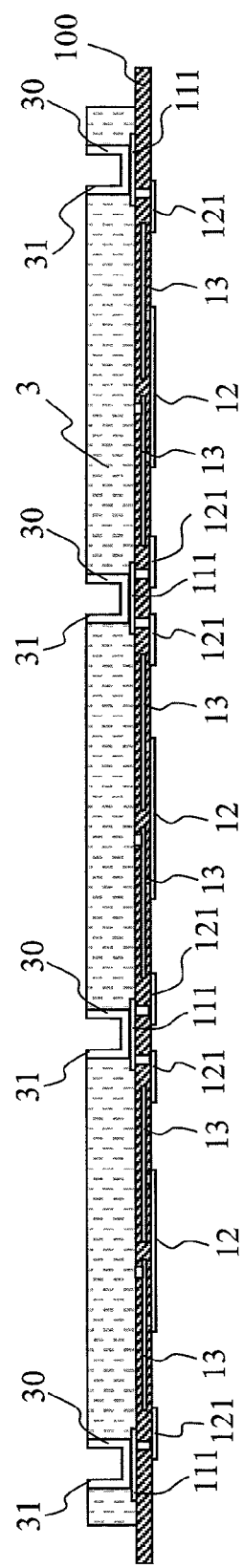
FIG. 23 A sectional view of a collective substrate after the hole-forming step illustrated in FIG. 22.

After the grooves 31 are formed in the groove forming step, holes 30 are formed at areas where the grooves 31 cross each other, that is, over the top surface ground wirings 111 (a hole-forming step). FIG. 22 is a plan view schematically illustrating the hole-forming step, and FIG. 23 is a sectional view illustrating a collective substrate after the hole-forming step illustrated in FIG. 22. In the hole-forming step, laser light Ls is applied to parts of the sealing resin layer 3 that are over the top surface ground wirings 111, to thereby form the holes 30 (see FIG. 23). The holes 30 are formed deeper than the grooves 31, such that the holes 30 reach the top surface ground wirings 111 (see FIG. 23).

After the holes 30 are formed in the hole-forming step, a metal film is formed to cover the top surface of the collective substrate 100 including the sealing resin layer 3. FIG. 24 is a plan view of the collective substrate after the film is formed thereon, FIG. 25 is a sectional view illustrating the collective substrate illustrated in FIG. 24 taken along line XXV-XXV of FIG. 24, and FIG. 26 is a sectional view illustrating the collective substrate illustrated in FIG. 24 taken along line XXVI-XXVI of FIG. 24.

An electrically conductive metal film is formed on the top surface of the sealing resin layer 3 in which the holes 30 and the grooves 31 are formed (a film-forming step). Note that the film-forming step here adopts the same film forming method as adopted in the film-forming step performed in the process of producing the semiconductor module A. In the film-forming step, the metal film is formed not only on the top surface of the sealing resin layer 3 but also on bottom and internal wall surfaces of both the holes 30 and the grooves 31 (see FIGS. 24, 25 and 26). Parts of the metal film that are formed on the bottom surfaces of the holes 30 are in contact with the top surface ground wirings 111. The metal film formed in the film-forming step here forms an exterior shield 4 and the connection sections 5 illustrated, for example, in FIGS. 17, 18 and 19.

The collective substrate 100 is, after the exterior shield 4 and the connection sections 5 are formed thereon, cut and separated (a dicing step). FIG. 27 is a sectional view illustrating the collective substrate after being divided in the dicing step. The dicing step is equivalent to a step of obtaining the individual semiconductor modules A. Dicing lines on which a dicing blade Db moves extend in middle parts of the bottom surfaces of the grooves 31, and the dicing blade Db cuts the bottom surfaces of the grooves 31 and those of the holes 30.

In the dicing step, in which the bottom surfaces of the grooves 31 and the bottom surfaces of the holes 30 are cut, a contact surface between the dicing blade Db and the metal film (the exterior shield 4b) is merely a surface corresponding to thickness of the metal film (the exterior shield 4b). Thus, in the dicing step, a contact area between the metal film (the exterior shield 4b) and the dicing blade can be reduced, and this helps reduce occurrence of inconveniences such as abrasion and chipping of the external shield due to friction between the metal film and the dicing blade. Furthermore, by reducing the contact area between the metal film (the exterior shield 4b) and the dicing blade, it is possible to reduce a heavy burden from being imposed on the dicing blade, and thus to prolong the life of the dicing blade, which accordingly helps enhance the productivity in producing the semiconductor modules.

Moreover, since the grooves 31 are formed so as not to reach the collective substrate 100 in the groove-forming step, the sealing resin layer 3 remains between the parts of the metal film that are formed on the bottom surfaces of the grooves 31 and the collective substrate 100. And, since the dicing blade Db cuts through the parts of the metal film that are formed on the bottom surfaces of the groove 31 in the dicing step, the sealing resin layer 3 is exposed from between each of the side surface shields 42b and the module substrate 1 at middle parts of side surfaces of the semiconductor module B, which are cut end surfaces. With the sealing resin layer 3 exposed in this way, it is possible, as described above, to prevent the inconvenience of the exterior shield 4b being connected to a signal line other than the ground line by solder undesiredly sticking to a side surface of the semiconductor module B when the semiconductor module B is mounted on, and soldered to, the mount substrate (not illustrated).

The other advantages of the second embodiment are the same as those of the first embodiment described above.

Third Embodiment

Figure 28:
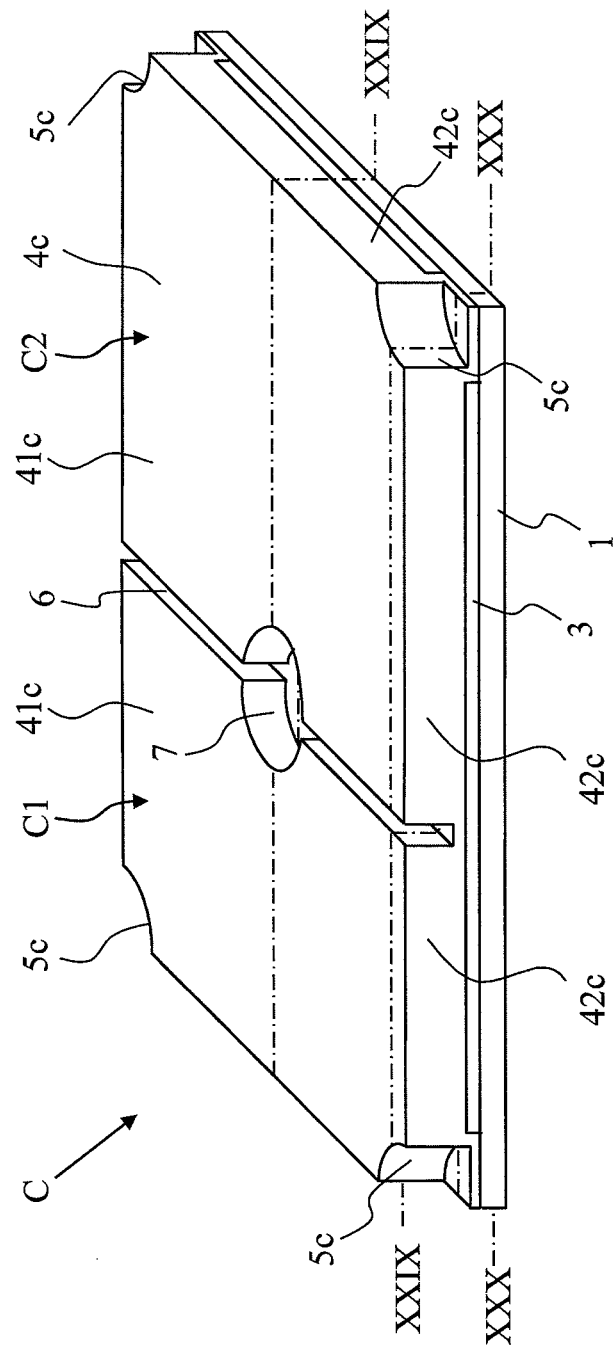
FIG. 28 A perspective view of still another example of the semiconductor module according to the present invention.
Figure 29:
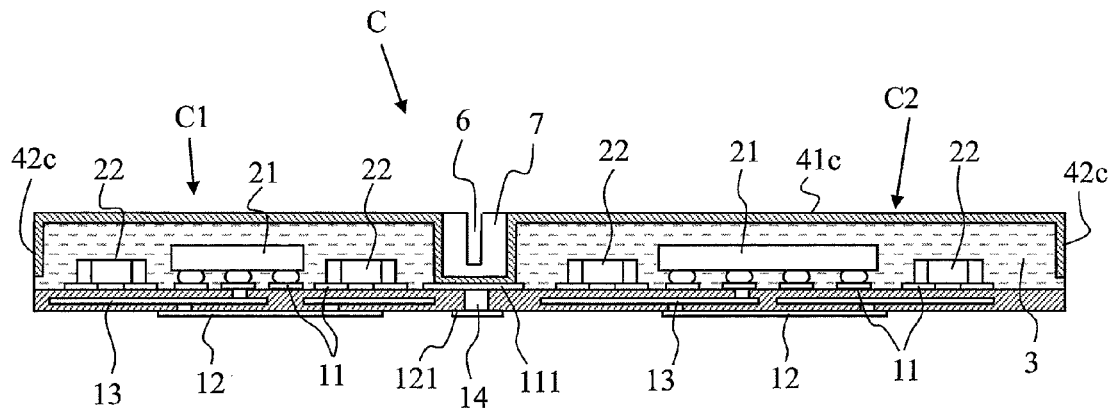
FIG. 29 A sectional view of the semiconductor module illustrated in FIG. 28, taken along line XXIX-XXIX of FIG. 28.
Figure 30:
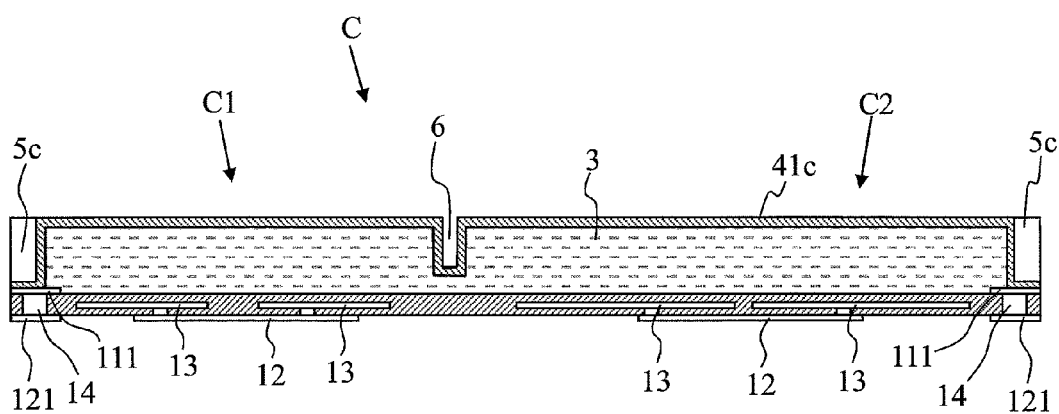
FIG. 30 A sectional view of the semiconductor module illustrated in FIG. 28, taken along line XXX-XXX of FIG. 28.

A description will be given of still another example of the semiconductor module of the present invention, with reference to appropriate drawings. FIG. 28 is a perspective view of still another example of the semiconductor module according to the present invention, FIG. 29 is a sectional view of the semiconductor module illustrated in FIG. 28 taken along line XXIX-XXIX of FIG. 28, and FIG. 30 is a sectional view of the semiconductor module illustrated in FIG. 28 taken along line XXX-XXX of FIG. 28. A semiconductor module C illustrated in FIGS. 28, 29, and 30 is a combined module including a first module portion C1 and a second module portion C2. The semiconductor module C has the same configuration as the semiconductor module B of the second embodiment except for an exterior shield 4c and connections sections 5c, and such parts as are substantially the same as counterparts thereof in the semiconductor module B are identified with common signs, and detailed descriptions thereof will be omitted.

As illustrated in FIG. 28, the semiconductor module C is rectangular in plan view, and has the connection sections 5c formed one at each of its four corners. The semiconductor module C includes the first module portion C1 and the second module portion C2, with a groove section 6 formed between the first and second module portions C1 and C2. In a middle part of the groove section 6, there is formed a cylinder-shaped connection section 7. That is, in the semiconductor module C, the connection sections 5c and 7 are formed at a total of five positions, namely at the four corners and the middle part thereof. The connection sections 5c and 7 ensure the grounding of the exterior shield 4c. Furthermore, by forming the connection section 7 in the middle part, it is possible to enhance the blocking property of the exterior shield 4c.

As illustrated in FIGS. 29 and 30, on a bottom surface and an internal wall of the groove section 6, a metal film (part of the exterior shield 4c) is formed to block (provide a shield against) an adverse effect (such as high frequency noise) caused by, for example, an electromagnetic field, static electricity, or the like from electronic components 2 mounted on the first module portion C1, to thereby reduce malfunction of the electronic components 2 mounted on the second module portion C2. And in reverse, it is possible to block (provide a shield against) an adverse effect (such as high frequency noise) caused by an electromagnetic field, static electricity, or the like from electronic components 2 mounted on the second module portion C2, to thereby reduce malfunction of the electronic components 2 mounted on the first module portion C1. By integrating a plurality of functions in one module in this way, it is possible to improve compactness in comparison with a case where a plurality of functions are separately formed. Furthermore, the semiconductor module C can be produced in a reduced number of steps, and this helps achieve a shorter tact time and accordingly higher productivity.

The production method adopted in this embodiment is the same as that adopted in the second embodiment. That is, electronic components are mounted on areas of a collective substrate in each of which the first module portion C1 is to be formed and on parts of the collective substrate in each of which the second module portion C2 is to be formed, resin sealing is applied thereto, and then grooves 31 are formed on dicing lines. At this time, a groove 31 is formed also at a boundary between the first module portion C1 and the second module portion C2. Then, after a metal film is formed on top of the resin sealing, a dicing blade is moved along the dicing lines to separate semiconductor modules C from each other. By producing individual semiconductor modules C in this way, as illustrated in FIG. 28, in each semiconductor module C, the top surface is shielded by a top surface shield 41c, the side surfaces are shielded by side surface shields 42c, and a boundary part between the first and second module portions C1 and C2 is shielded by the part of the metal film formed in the groove section 6, and this helps ensure the operation of the first module portion C1 and the second module portion C2.

Incidentally, although the semiconductor module C illustrated in FIG. 28 includes a cylinder-shaped connection section 7 formed in the middle of the boundary part between the first and second module portions C1 and C2, if the grounding of the exterior shield 4c is ensured by the connection sections 5c formed at the four corners of the semiconductor module C, the connection section 7 may be omitted. Besides, it is possible to produce the semiconductor module C by cutting the collective substrate 100 illustrated in FIG. 24 at the grooves 31 except those between adjacent individual module sections. Furthermore, this embodiment deals with a semiconductor module provided with two independently-operating module portions as an example, but this is not meant as a limitation, and three or more module portions may be provided. Here, the groove sections 6 may be formed at all the boundaries between adjacent module portions as in the present embodiment to be shielded, or alternatively, the groove sections 6 may be formed only at the boundary between such module portions that affects each other to be shielded.

The other advantages of the third embodiment are the same as those of the first and second embodiments described above.

Fourth Embodiment

Figure 31:
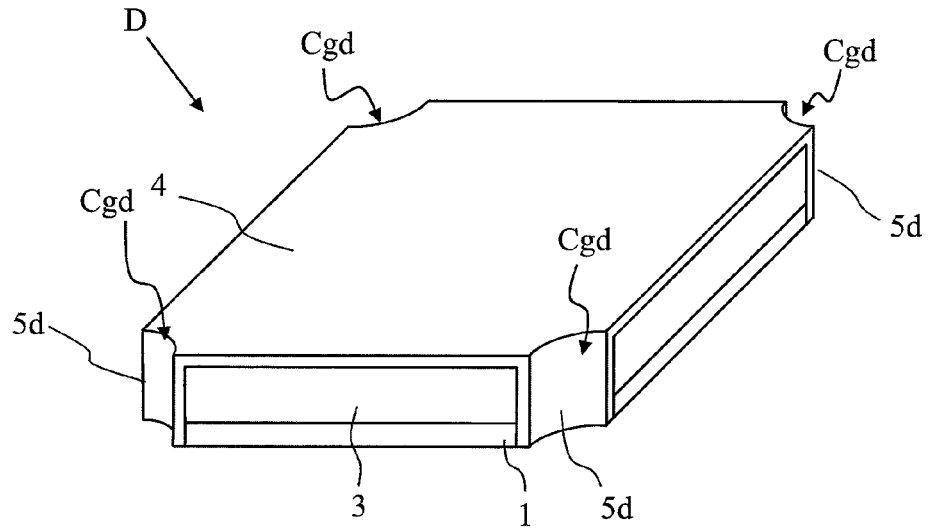
FIG. 31 A perspective view of still another example of the semiconductor module according to the present invention.
Figure 32:
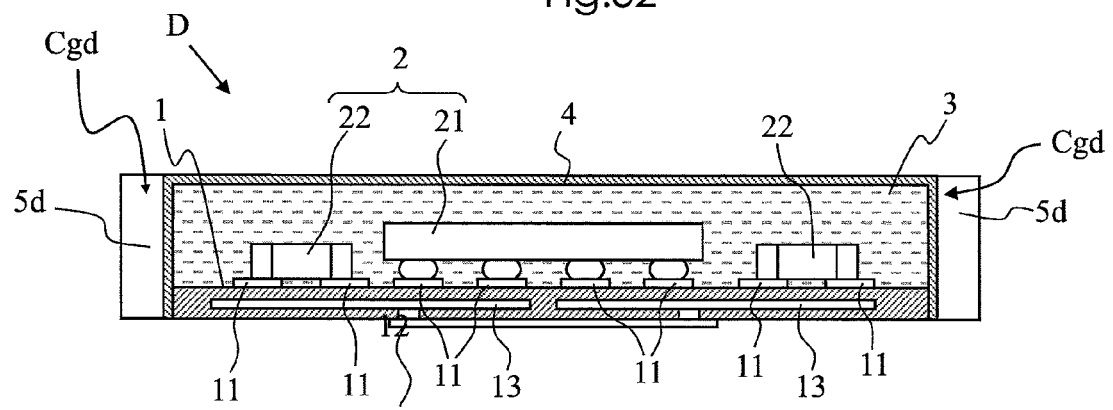
FIG. 32 A sectional view of the semiconductor module illustrated in FIG. 31.
Figure 33:
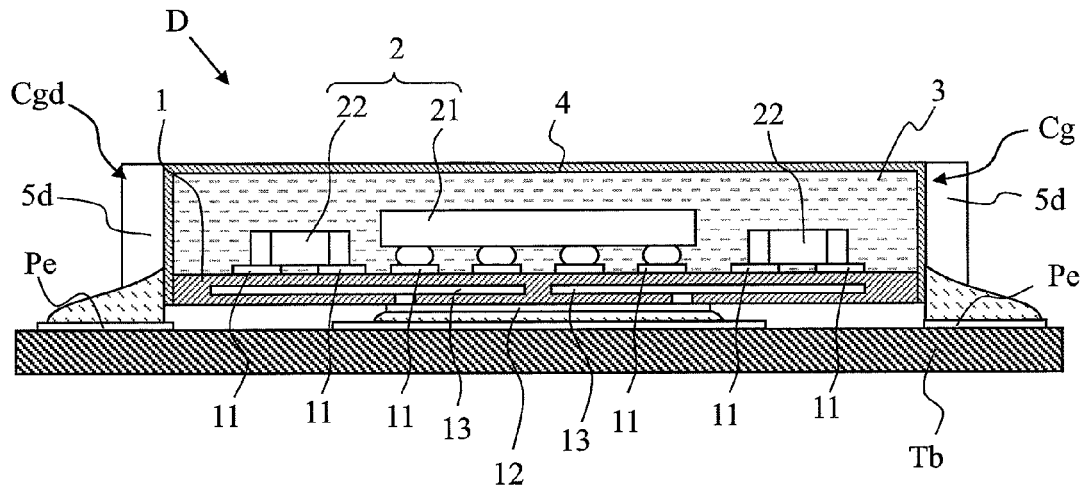
FIG. 33 A sectional view illustrating a state where the semiconductor module illustrated in FIG. 32 is mounted on a mount substrate.
Figure 34:
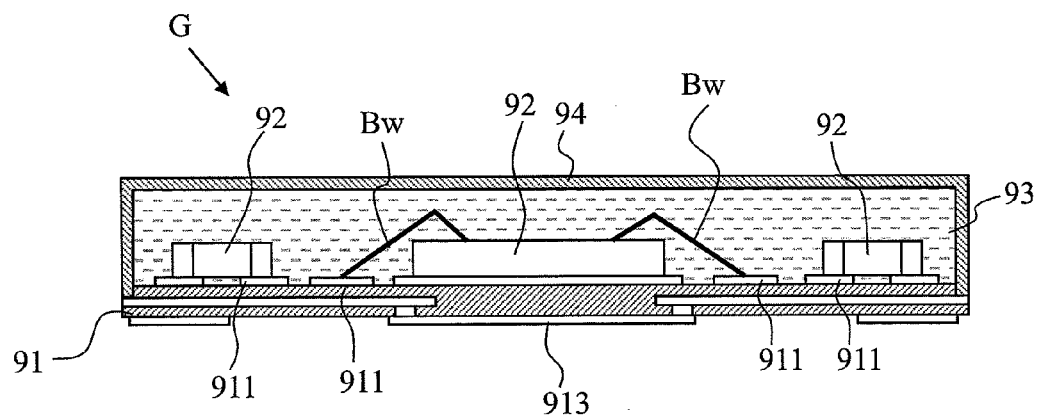
FIG. 34 A schematic sectional view of an improved version of a conventional semiconductor module.
Figure 35:
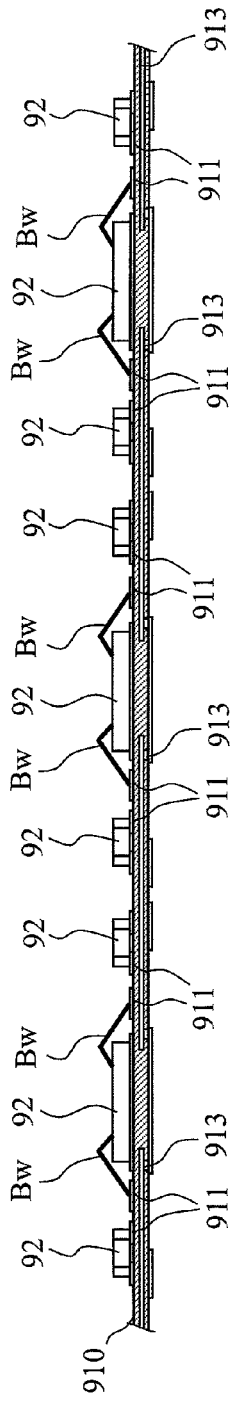
FIG. 35 A schematic sectional view illustrating a mounting step performed in producing a conventional semiconductor module.
Figure 36:
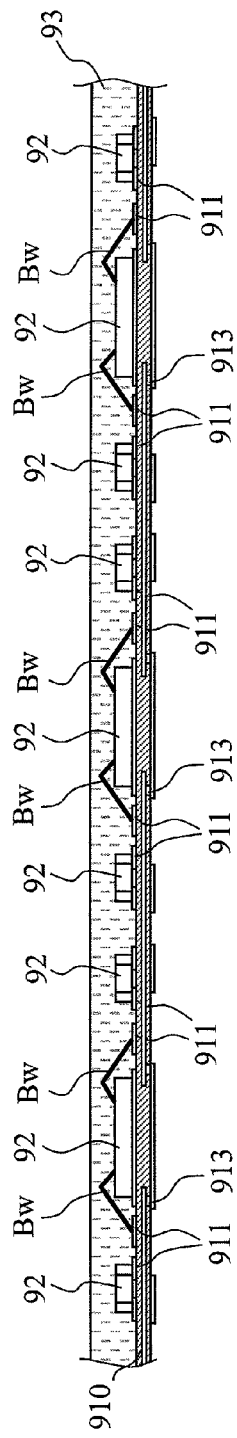
FIG. 36 A schematic sectional view illustrating a sealing step performed in producing the conventional semiconductor module.
Figure 37:
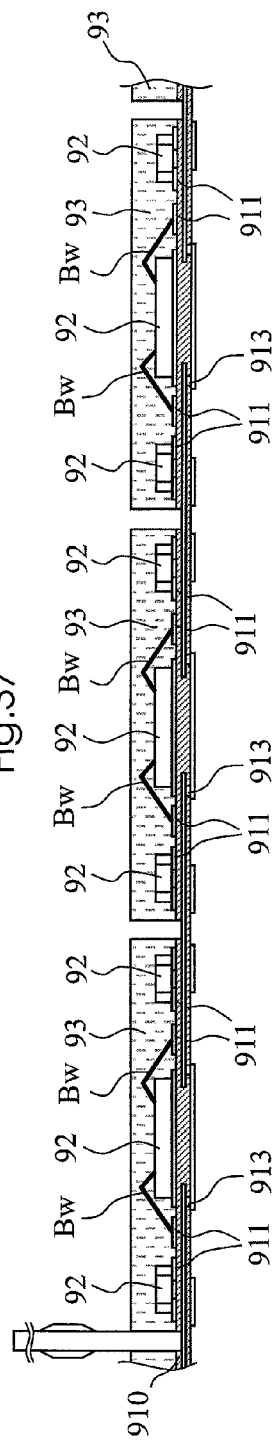
FIG. 37 A schematic diagram showing a first dicing step performed in producing the conventional semiconductor module.

A description will be given of still another example of the semiconductor module of the present invention, with reference to the accompanying drawings. FIG. 31 is a perspective view of still another example of the semiconductor module according to the present invention, FIG. 32 is a sectional view illustrating the semiconductor module illustrated in FIG. 31, and FIG. 33 is a sectional view illustrating a state where the semiconductor module illustrated in FIG. 32 is mounted on a mounting board. A semiconductor module D illustrated in FIG. 31 has the same configuration as the semiconductor module A of the first embodiment except for a connection section 5d, and among parts of the semiconductor module D, those substantially the same as their counterparts in the semiconductor module A are identified with common symbols and their detailed descriptions will be omitted. Furthermore, the semiconductor module D is produced in a similar production process as the semiconductor module A except that a through hole is formed in a hole-forming step, and thus a detailed description thereof will be omitted.

As illustrated in FIGS. 31 and 32, the semiconductor module D includes grooves Cgd extending from a top surface through a bottom surface of the semiconductor module D, and on side walls of the grooves Cgd, connection sections 5d are formed of the same metal film as the exterior shield 4. And, as illustrated in FIG. 33, the connection sections 5d are directly soldered to a ground wiring Pe of a mount substrate Tb. This makes it possible to omit a top surface ground wiring 111 from a top surface of a module substrate 1, to omit a bottom surface ground wiring 121 from a bottom surface of the module substrate 1, and to omit a via hole 14 that connects the top surface ground wiring 111 and the bottom surface ground wiring 121.

Thus, since the top surface ground wiring 111 and(or) the bottom surface ground wiring 121 are(is) not provided, the module substrate 1 can be made compact and simple. Furthermore, in the production process, since through holes are formed in the hole-forming step, there is no need of controlling the depth of the holes, which accordingly results in easier production. Moreover, since there is no need of forming a flat bottom surface, the hole-forming step can be carried out by using a drill.

The other advantages of the fourth embodiment are the same as those of the first to third embodiments described above.

Fifth Embodiment

Figure 41:
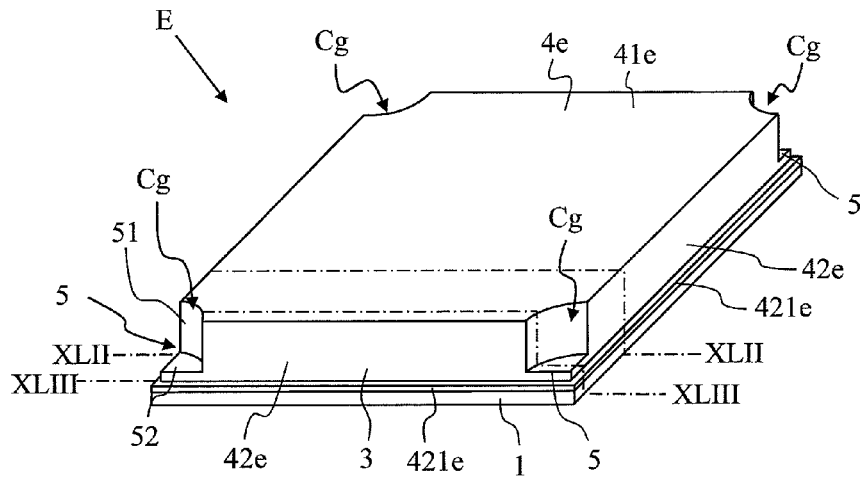
FIG. 41 A perspective view of still another example of the semiconductor module according to the present invention.
Figure 42:
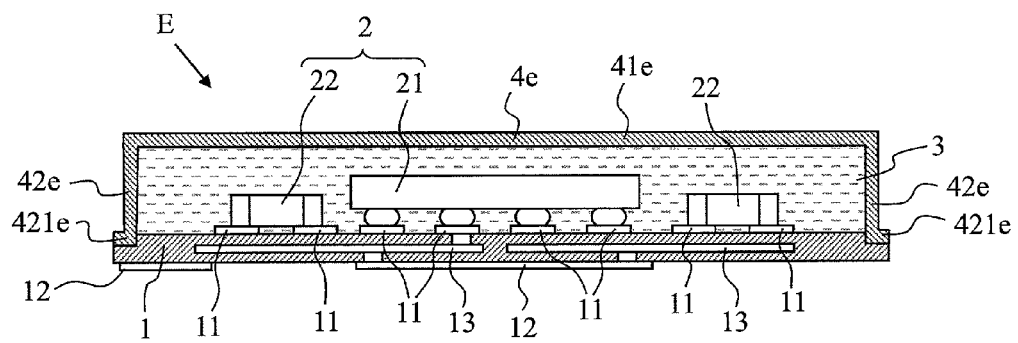
FIG. 42 A sectional view of the semiconductor module illustrated in FIG. 41, taken along line XLII-XLII of FIG. 41.
Figure 43:
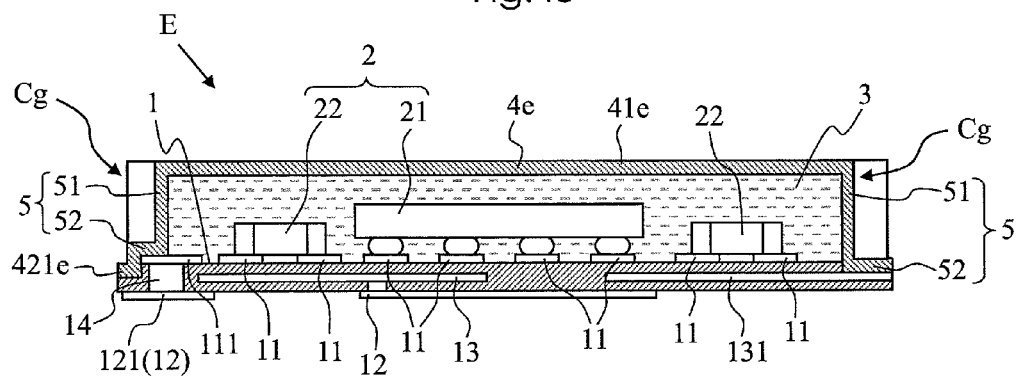
FIG. 43 A sectional view of the semiconductor module illustrated in FIG. 41, taken along line XLIII-XLIII of FIG. 41.

A description will be given of another example of the semiconductor module of the present invention, with reference to the accompanying drawings. FIG. 41 is a perspective view of another example of the semiconductor module according to the present invention, FIG. 42 is a sectional view illustrating the semiconductor module illustrated in FIG. 41 taken along line XLII-XLII of FIG. 41, and FIG. 43 is a sectional view illustrating the semiconductor module illustrated in FIG. 41 taken along line XLIII-XLIII of FIG. 41. Note that the semiconductor module E illustrated in the figures has the same configuration as the semiconductor module A except that an exterior shield 4e and a connection section 5 illustrated on the right side in FIG. 43 is connected to a ground wiring (an internal layer ground wiring 131) included in internal wirings 13 formed in a module substrate 1. Among parts forming the semiconductor module E, those substantially the same as their counterparts forming the semiconductor module A are identified with common symbols and their detailed descriptions will be omitted.

As illustrated in FIG. 41, the exterior shield 4e includes a top surface shield 41e which covers a top surface of a sealing resin layer 3 and side surface shields 42e which cover side surfaces of the sealing resin layer 3. In more detail, the top surface shield 41e has the same shape as the exterior shield 4 of the semiconductor module A, that is, the top surface shield 41e is a square plate member having sector-shaped cuts formed at four corners thereof. As illustrated in the figures, the side surface shields 42e are rectangular plate members formed to cover the side surfaces of the sealing resin layer 3 such that two ends thereof in the longitudinal direction thereof are each connected to a corresponding one of connection sections 5. The side surface shields 42e are also connected to the top surface shield 41e at one of long sides thereof (see FIGS. 41 and 42). Here, in the exterior shield 4e illustrated in the figures, the top surface shield 41e and the side surface shields 42e are integrally formed with each other. The side surface shields 42e and the connection sections 5 are also integrally formed with each other. And, the side surface shields 42e each have a shield lower end section 421e formed along the other one of the long sides thereof. The shield lower end section 421e projects toward outside and is connected to the module substrate 1.

In the semiconductor module E, as in the semiconductor module A, the connection sections 5 are electrically connected to top surface ground wirings 111 formed on a top surface of a module substrate 1. Thereby, the exterior shield 4e is grounded, that is, the top surface shield 41e and the side surface shields 42e are grounded. This makes it possible to improve the effect of the exterior shield 4e to block (provide a shield against) an adverse effect (such as high frequency noise) caused by an electromagnetic field or static electricity. Furthermore, by forming the side surface shields 42e to extend into part of the module substrate 1, it is possible to reduce intrusion of water into a sealing resin layer 3 in the form of moisture, for example, and thus to reduce risk of cracks and the like occurring in the sealing resin layer 3 at a time of reflow soldering. Note that experiment results of a shelf test conducted under a condition of 30° C./60% RH/192H show that weight increase after the shelf test was reduced from 0.083% to 0.017% by forming the side surface shields 42e into part of the module substrate 1.

Also, as illustrated in FIG. 43, a connection section 5 is connected to a grounded wiring (internal layer ground wiring 131) included in internal layer wirings 13 of the module substrate 1. Typical multilayer substrates often include a large-area internal layer ground wiring 131. By connecting the connection sections 5 to the internal layer ground wiring 131, the exterior shield 4 can be connected to a large-area ground wiring with a minimum distance therebetween. This makes it possible to enhance the shielding effect of the external shield 4e. This also makes it possible to omit the top surface ground wiring 111, and thus to make the semiconductor module E compact.

It should be noted that, although one of the connection sections 5 located on the right side in FIG. 43 alone is connected to the internal layer ground wiring 131, this is not meant as a limitation. For example, the connection sections 5 at all of the four corners may be connected to the internal layer ground wiring 131, or, the connection sections 5 at all of the four corners may be connected to the top surface ground wiring 111. Alternatively, there may be provided at least one connection section 5 that is connected to the internal layer ground wiring 131 and at least one connection section 5 that is connected to the top surface ground wiring 111. Still alternatively, the connection sections 5 may be connected to the bottom surface ground wiring 121.

Next, a description will be given of a process of producing the semiconductor module E illustrated in FIG. 41, with reference to appropriate figures. FIGS. 44 to 50 are diagrams schematically illustrating part of the process of producing a semiconductor module illustrated in FIG. 41. The process of producing the semiconductor module E is the same as that of producing the semiconductor module A until the mounting step and the sealing step. That is, a plurality of electronic components 2 are mounted on a top surface of a collective substrate 100, and then the top surface of the collective substrate 100 is sealed with an insulating resin.

Figure 44:
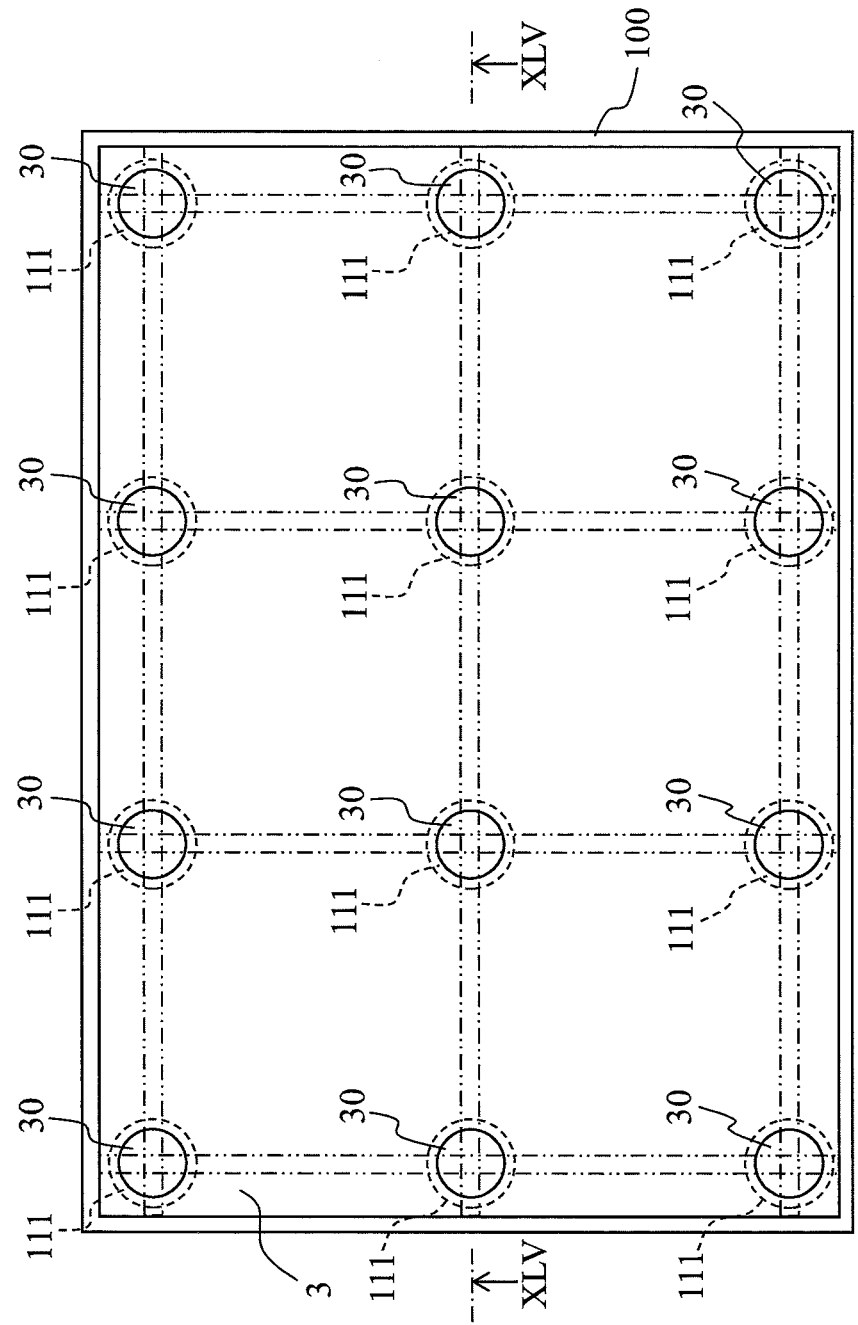
FIG. 44 A plan view of a collective substrate in which holes are formed in a surface of a sealing resin after a sealing step.
Figure 45:
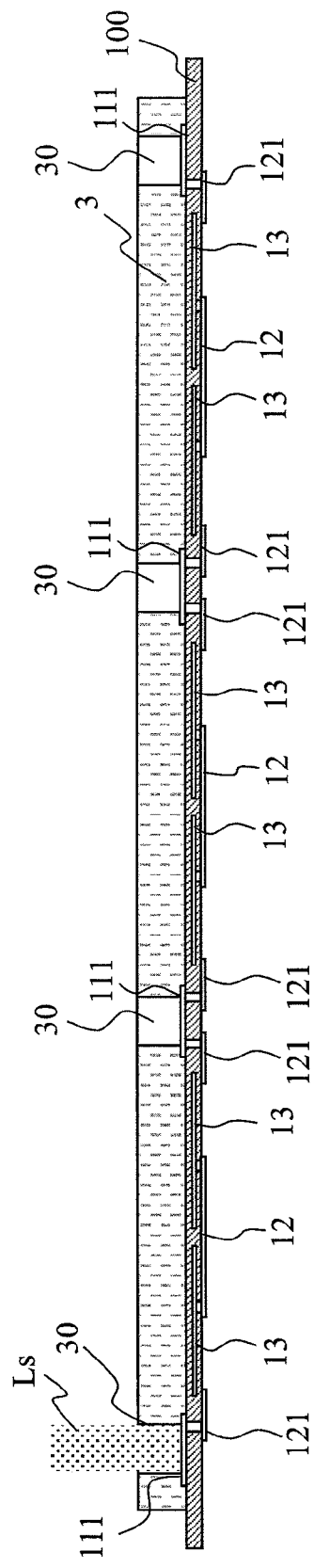
FIG. 45 A sectional view of the collective substrate illustrated in FIG. 44, taken along line XLV-XLV of FIG. 44.

FIG. 44 is a plan view of a collective substrate in which circular holes are formed in a surface of a sealing resin after a sealing step, and FIG. 45 is a sectional view illustrating the collective substrate illustrated in FIG. 44 taken along line XLV-XLV of FIG. 44. After the sealing step (see FIG. 6), holes 30, which are each circular shaped in section, are formed in a top surface of the collective substrate 100 where a sealing resin layer 3 is formed (hole-forming step). In the hole-forming step, laser light Ls is applied to parts of a top surface of the sealing resin layer 3 under which grooves 31 (indicated by two-dot chain lines) which are formed in a later-described groove-forming step cross each other. At parts of the top surface of the collective substrate 100 where the grooves cross each other, there are disposed top surface ground wirings 111 are arranged (see FIG. 44), and by the application of the laser light Ls, the holes 30 are formed to reach the top surface ground wirings 111 (see FIG. 45). Incidentally, in a case in which a connection section 5 is directly connected to the internal layer ground wiring 131, in the hole-forming step, the holes 30 are formed to reach the internal layer ground wiring 131. Furthermore, in a case in which the connection sections 5 are directly connected to the bottom surface ground wiring 121, in the hole-forming step, the holes 30 are formed to reach the bottom surface ground wiring 121.

Figure 46:
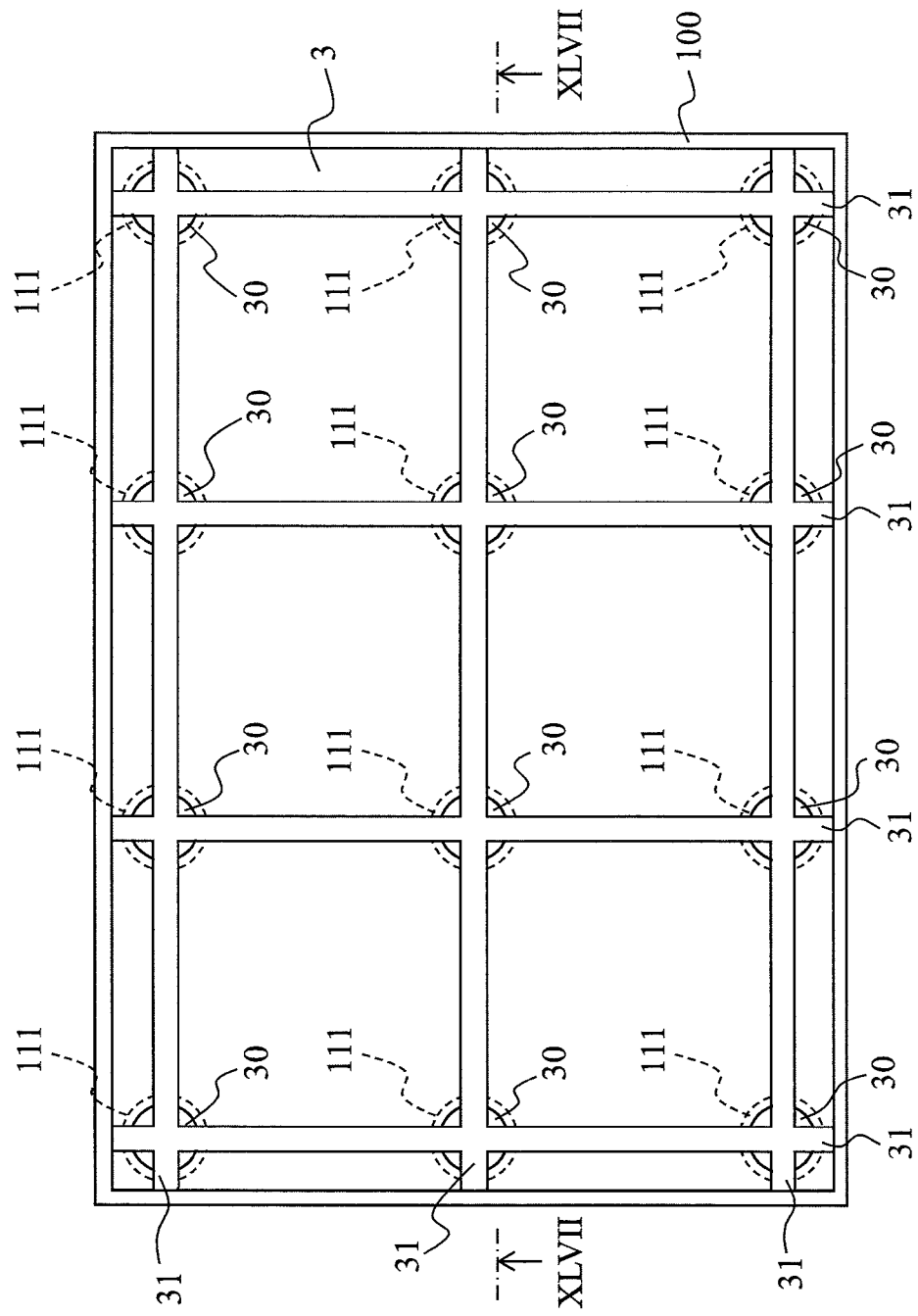
FIG. 46 A plan view schematically illustrating a groove-forming step.
Figure 47:
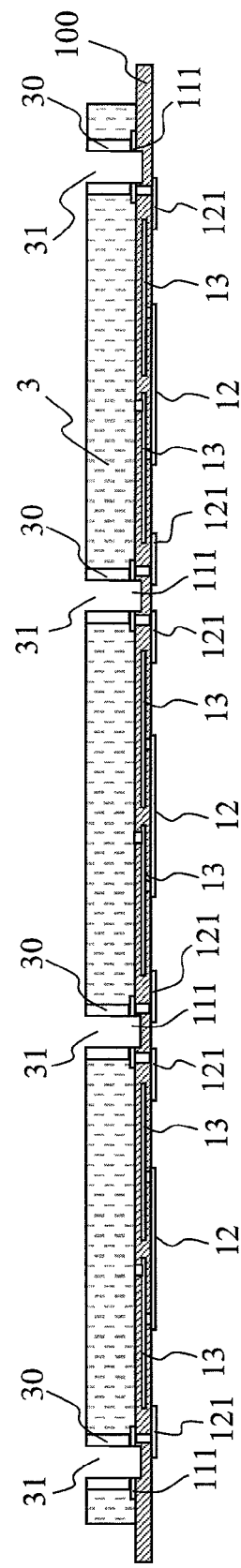
FIG. 47 A sectional view of the collective substrate illustrated in FIG. 46, taken along line XLVII-XLVII of FIG. 46.

FIG. 46 is a plan view schematically illustrating the groove-forming step, and FIG. 47 is a sectional view illustrating the collective substrate illustrated in FIG. 46 taken along line XLVII-XLVII of FIG. 46. After the holes 30 are formed in the sealing resin layer 3 in the hole-forming step (see FIGS. 44 and 45), the linear grooves 31 are formed to be laid through adjacent ones of the top surface ground wirings 111 and the holes 30.

As illustrated in FIG. 47, a bottom surface of each of the grooves 31 reaches (inside of) the collective substrate 100. Note that the production process of the semiconductor module E is different from that of the semiconductor module B in that the hole-forming step and the groove-forming step are performed in a reverse order. A reason for performing the hole-forming step and the groove-forming step in the reverse order is as follows.

Assume that the grooves 31 are formed before the holes 31. The grooves 31 are formed to be laid through the top surface ground wirings 111 as described above, so the grooves 31 are formed at the top surface ground wiring 111 as well. In the hole-forming step, the laser light Ls of a radiation diameter equal to an inner diameter of the holes 30 is applied to thereby form the holes 30 to reach the top surface ground wirings 111. Then, in the areas to which the laser light Ls is to be applied, the sealing resin layer 3 is thinner at parts thereof where the grooves 31 have been formed than at the other parts, and thus at such parts, a distance that the laser light Ls needs to travel to reach the top surface ground wirings is shorter than at the other parts where no grooves 31 have been formed. If the laser light Ls is applied and the holes 30 are formed in this state, there is a risk of the holes 30 penetrating through the collective substrate 100 at the parts where the grooves 31 have been formed.

If the laser light Ls forms any of the holes 30 to penetrate in such a manner, when a wet plating method is used in a later-described film-forming step, plating solution reaches a rear surface of the collective substrate 100 and soils the rear surface, which is disadvantageous. To prevent such soiling of the rear surface, in this embodiment, the hole-forming step is performed before the groove-forming step.

Figure 48:
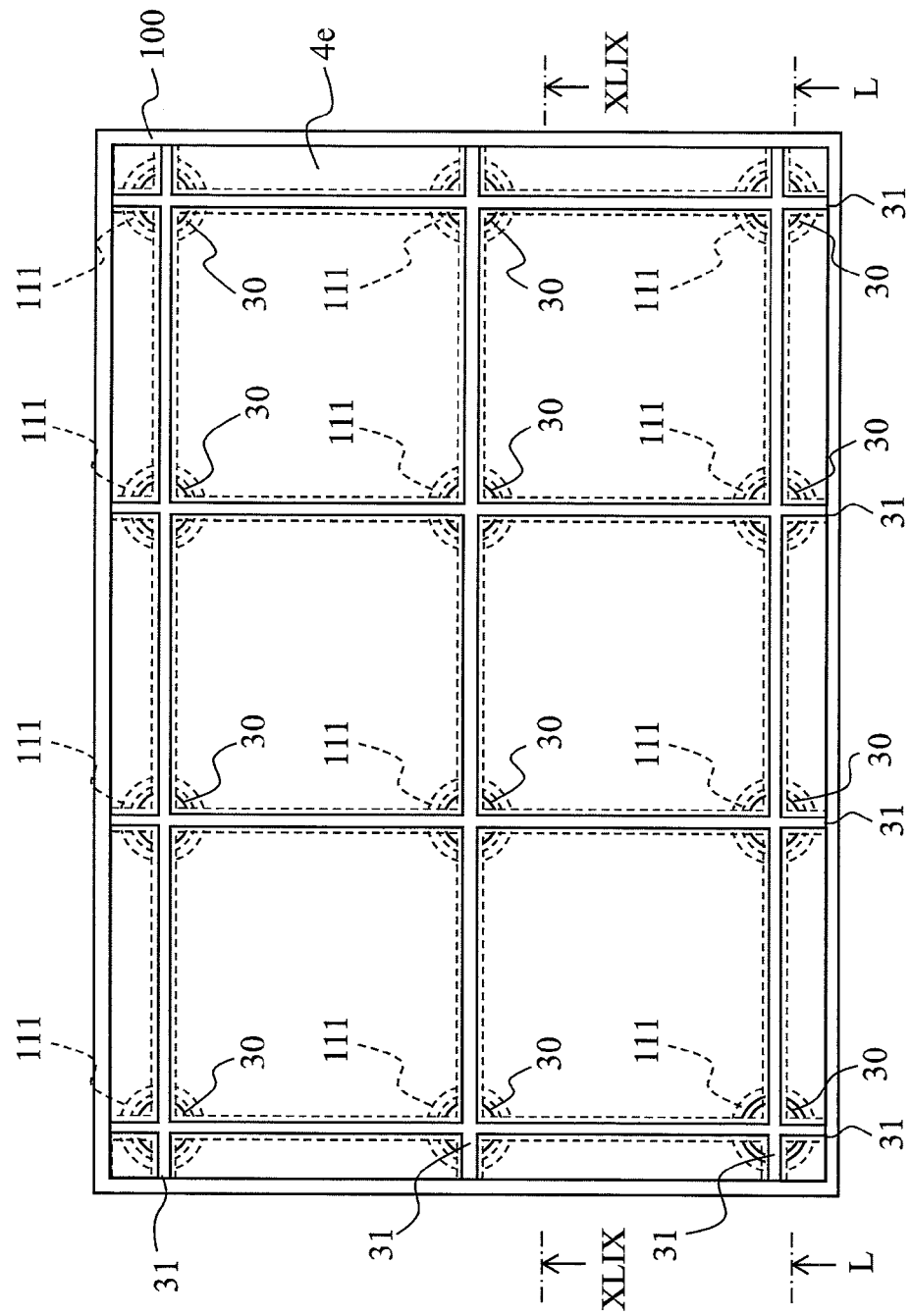
FIG. 48 A plan view of a collective substrate after a film is formed thereon.
Figure 49:
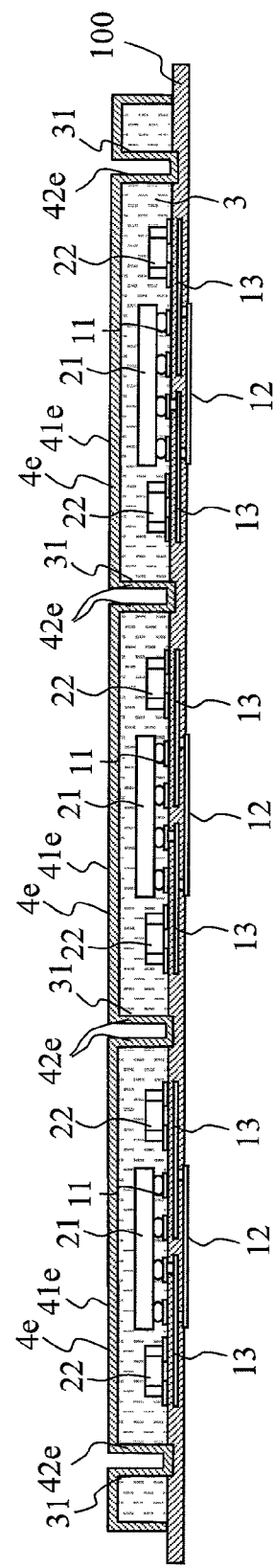
FIG. 49 A sectional view of the collective substrate illustrated in FIG. 48, taken along line XLIX-XLIX of FIG. 48.
Figure 50:
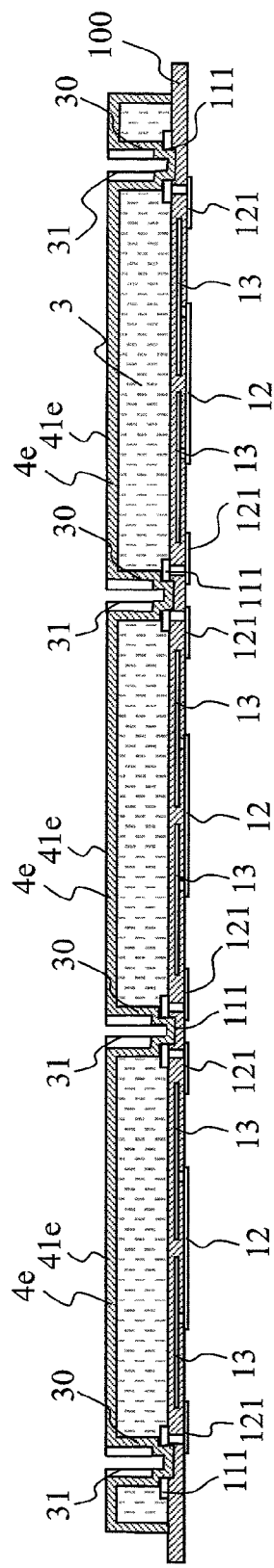
FIG. 50 A sectional view of the collective substrate illustrated in FIG. 48, taken along line L-L of FIG. 48, FIG. 51 A sectional view illustrating a collective substrate after being cut in a dicing step.

And, after the grooves 31 are formed in the groove-forming step, a metal film is formed (film formation) to cover the top surface of the collective substrate 100 including the sealing resin layer 3. FIG. 48 is a plan view of a collective substrate after a film is formed thereon, FIG. 49 is a sectional view of the collective substrate illustrated in FIG. 48 taken along line XLIX-XLIX of FIG. 48, and FIG. 50 is a sectional view of the collective substrate illustrated in FIG. 48 taken along line L-L of FIG. 48.

An electrically conductive metal film is formed on the top surface of the sealing resin layer 3 in which the holes 30 and the grooves 31 are formed (film-forming step). Note that the method of forming the metal film adopted in the film-forming step is the same as the method adopted in the film-forming step performed in the process of producing the semiconductor module A. In the film-forming step, the metal film is formed not only on the top surface of the sealing resin layer 3 but also on bottom surfaces and inner wall surfaces of the holes 30 and the grooves 31 (see FIGS. 48, 49, and 50). The parts of the metal film formed on the bottom surfaces of the holes 30 are in contact with the top surface ground wirings 111. Note that the metal film formed in the film-forming step forms the exterior shield 4 and the connection sections 5 illustrated in drawings such as FIGS. 41, 42 and 43.

Figure 51:
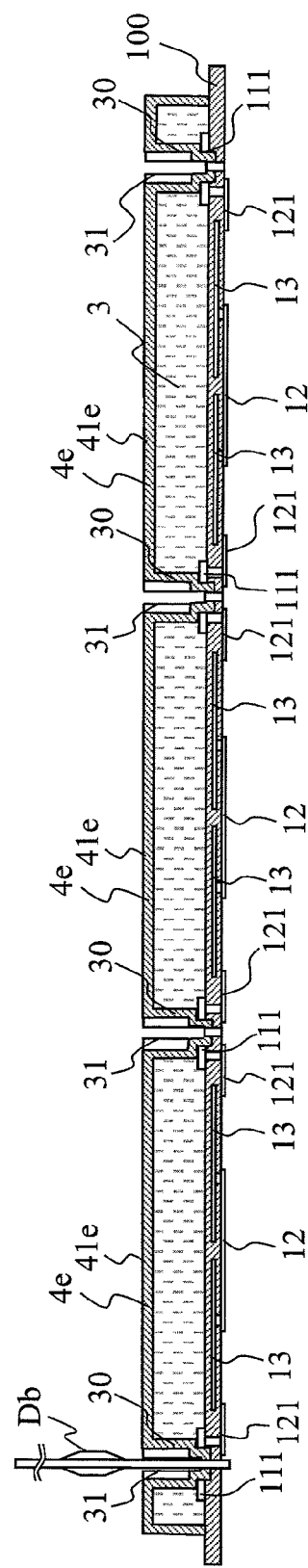

The collective substrate 100 is, after the exterior shield 4 and the connection sections 5 are formed thereon, cut and separated (dicing step). FIG. 51 is a sectional view illustrating a collective substrate which is cut in the dicing step. The dicing step is equivalent to the step of obtaining the individual semiconductor modules A. Dicing lines on which a dicing blade Db moves are in middle parts of the bottom surfaces of the grooves 31, and the dicing blade Db cuts the bottom surfaces of the grooves 31 and those of the holes 30.

In the dicing step, in which the bottom surfaces of the grooves 31 and the holes 30 are cut, a contact surface between the dicing blade Db and the metal film (the exterior shield 4e) is merely a surface corresponding to thickness of the metal film (the exterior shield 4e). Thus, in the dicing step, a contact area between the metal film (the exterior shield 4e) and the dicing blade can be reduced, and this helps reduce occurrence of inconveniences such as abrasion and chipping of the external shield due to friction between the metal film and the dicing blade. Furthermore, by reducing the contact area between the metal film (the exterior shield 4e) and the dicing blade, it is possible to reduce a heavy burden from being imposed on the dicing blade, and thus to prolong the life of the dicing blade, which accordingly helps enhance the productivity with which the semiconductor modules are produced. These features help enhance the productivity in producing the semiconductor module E.

By forming the grooves 31 to partially extend into the collective substrate 100 in the groove-forming step, the electrically conductive metal film also functions to reduce intrusion of water into the sealing resin layer 3 in the form of moisture or the like. Furthermore, by cutting off part of the substrate to form the metal film, boundary parts between the module substrate 1 and the sealing resin layer 3 on the side surfaces of the semiconductor module E are covered with the metal film. This helps enhance the effect of reducing intrusion of water, and thus it is possible to reduce the risk of cracks and the like of resin occurring in the reflow soldering.

The other advantages of the fifth embodiment are the same as those of the first embodiment described above.

Sixth Embodiment

Figure 52:
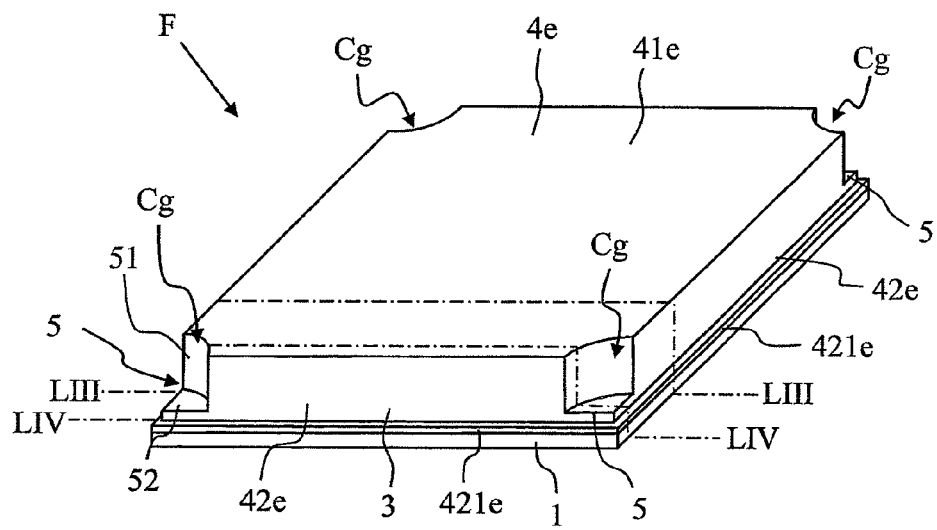
FIG. 52 A perspective view of still another example of the semiconductor module according to the present invention.
Figure 53:
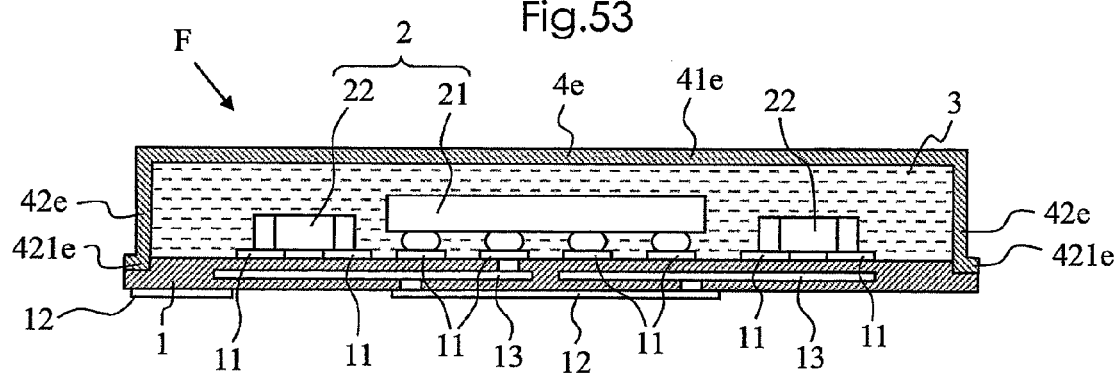
FIG. 53 A sectional view of the semiconductor module illustrated in FIG. 52, taken along line LIII-LIII of FIG. 52.
Figure 54:
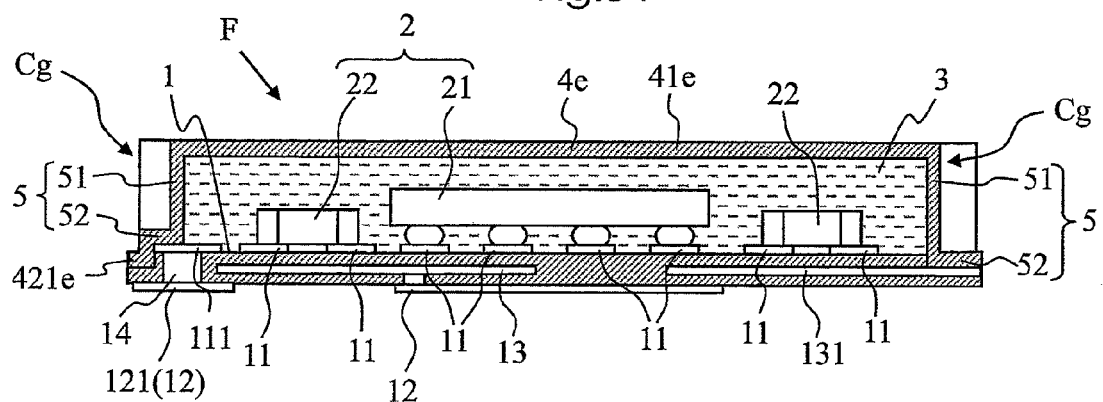
FIG. 54 A sectional view of the semiconductor module illustrated in FIG. 52, taken along line LIV-LIV of FIG. 52.

A description will be given of another example of the semiconductor module of the present invention, with reference to the accompanying drawings. FIG. 52 is a perspective view of another example of the semiconductor module according to the present invention, FIG. 53 is a sectional view of the semiconductor module illustrated in FIG. 52 taken along line LIII-LIII of FIG. 52, and FIG. 54 is a sectional view of the semiconductor module illustrated in FIG. 52 taken along line LIV-LIV of FIG. 52. Note that the semiconductor module F illustrated in the figures has the same configuration as the semiconductor module E. Among parts forming the semiconductor module F, those substantially the same as their counterparts forming the semiconductor module E are identified with common symbols and their detailed descriptions will be omitted.

As illustrated in FIG. 52, an exterior shield 4e includes a top surface shield 41e which covers a top surface of a sealing resin layer 3 and side surface shields 42e which cover side surfaces of the sealing resin layer 3. The semiconductor module F has a configuration similar to that of the semiconductor module E, and thus detailed description thereof will be omitted.

In the semiconductor module F, as in the semiconductor module E, connection sections 5 are electrically connected to top surface ground wirings 111 formed on a top surface of a module substrate 1. Thereby, the exterior shield 4e is grounded, that is, the top surface shield 41e and the side surface shields 42e are grounded. This makes it possible to improve the effect of the exterior shield 4e to block (provide a shield against) an adverse effect (such as high frequency noise) caused by an electromagnetic field or static electricity. Furthermore, by forming the side surface shields 42e into part of the module substrate 1, it is possible to reduce intrusion of water into a sealing resin layer 3 in the form of moisture or the like, and thus to reduce the risk of cracks and the like of the sealing resin layer 3 occurring in the reflow soldering. Note that experiment results of a shelf test conducted under a condition of 30° C./60% RH/192H show that weight increase after the shelf test was reduced from 0.083% to 0.017% by forming the side surface shields 42e into part of the module substrate 1.

Also, as illustrated in FIG. 54, a connection section 5 is connected to a grounded wiring (an internal layer ground wiring 131) included in internal layer wirings 13 of the module substrate 1. Typical multilayer substrates often include a large-area internal layer ground wiring 131. By connecting a connection section 5 to the internal layer ground wiring 131, the exterior shield 4 can be connected to a large-area ground wiring with a minimum distance therebetween. This makes it possible to enhance the shielding effect of the external shield 4e. This also makes it possible to omit the top surface ground wiring 111, and thus to make the semiconductor module E compact.

It should be noted that, although one of the connection sections 5 located on the right side in FIG. 54 alone is connected to the internal layer ground wiring 131, this is not meant as a limitation. For example, the connection sections 5 at all of the four corners may be connected to the internal layer ground wiring 131, or, the connection sections 5 at all of the four corners may be connected to the top surface ground wiring 111. Alternatively, there may be provided at least one connection section 5 that is connected to the internal layer ground wiring 131 and at least one connection section 5 that is connected to the top surface ground wiring 111. Still alternatively, the connection sections 5 may be connected to the bottom surface ground wiring 121.

Next, a description will be given of a process of producing the semiconductor module E illustrated in FIG. 52, with reference to appropriate drawings. FIGS. 55 to 61 are diagrams schematically illustrating part of the process of producing a semiconductor module illustrated in FIG. 52. The process of producing the semiconductor module F is the same as that of producing the semiconductor module E until the mounting step and the sealing step. That is, a plurality of electronic components 2 are mounted on a top surface of a collective substrate 100, and then the top surface of the collective substrate 100 is sealed with an insulating resin.

Figure 55:
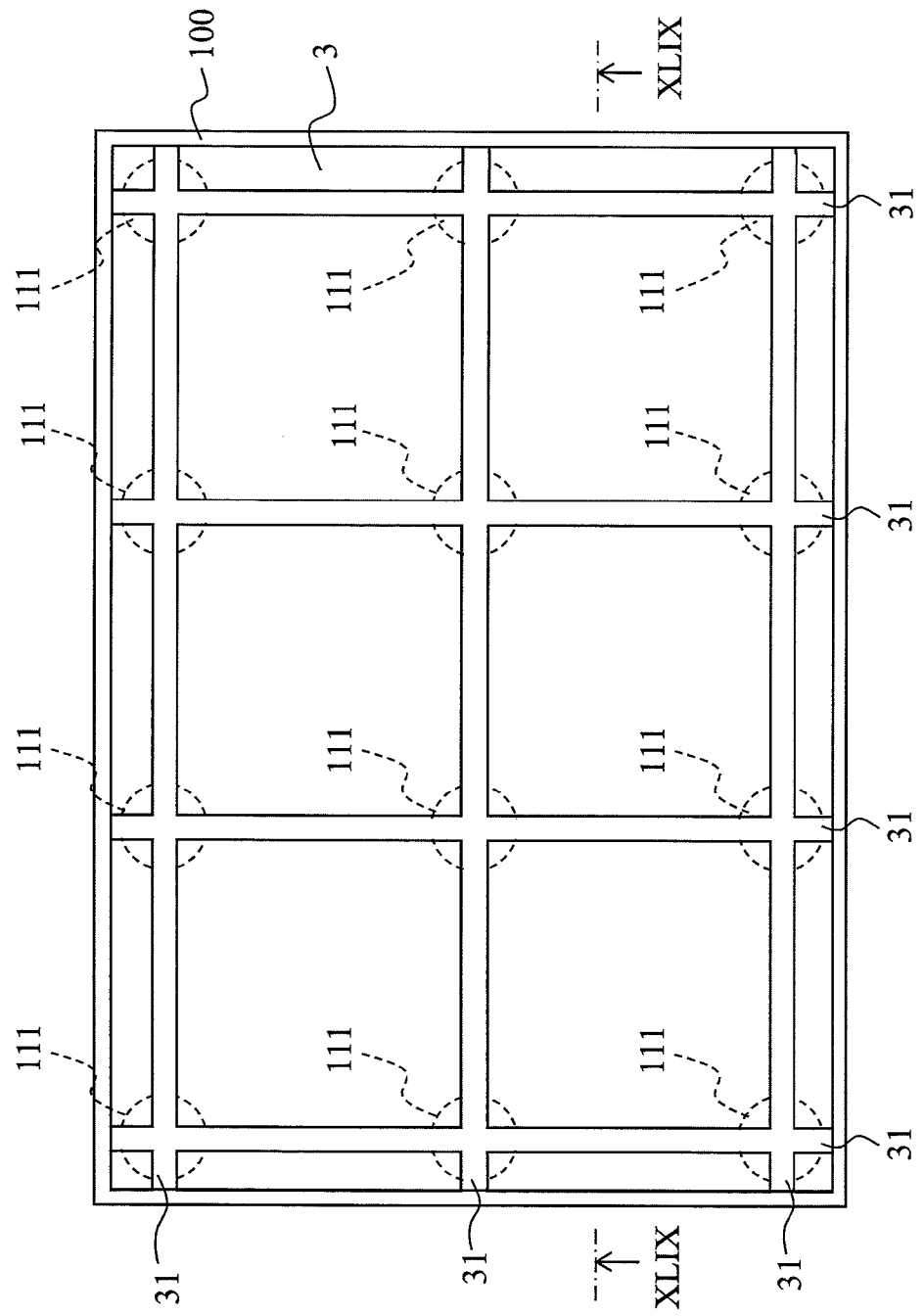
FIG. 55 A plan view of a collective substrate in which grooves are formed in a surface of a sealing resin after a sealing step.
Figure 56:
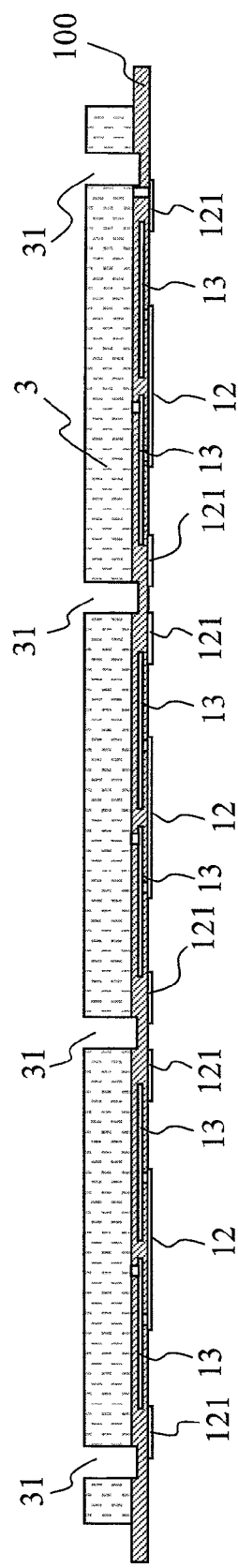
FIG. 56 A sectional view of the collective substrate illustrated in FIG. 55, taken along line LVI-LVI of FIG. 55.

FIG. 55 is a plan view of a collective substrate in which grooves are formed in a surface of a sealing resin after a sealing step, and FIG. 56 is a sectional view of the collective substrate illustrated in FIG. 55 taken along line LVI-LVI of FIG. 55. After a sealing resin layer 3 is formed on the top surface of the collective substrate 100 in the sealing step (see FIG. 6), linear grooves 31 are formed in a top surface of the sealing resin layer 3 to connect adjacent top surface ground wirings 111 and to be laid over the top surface ground wirings 111. As illustrated in FIG. 56, a bottom surface of each of the grooves 31 reaches the collective substrate 100.

Figure 58:
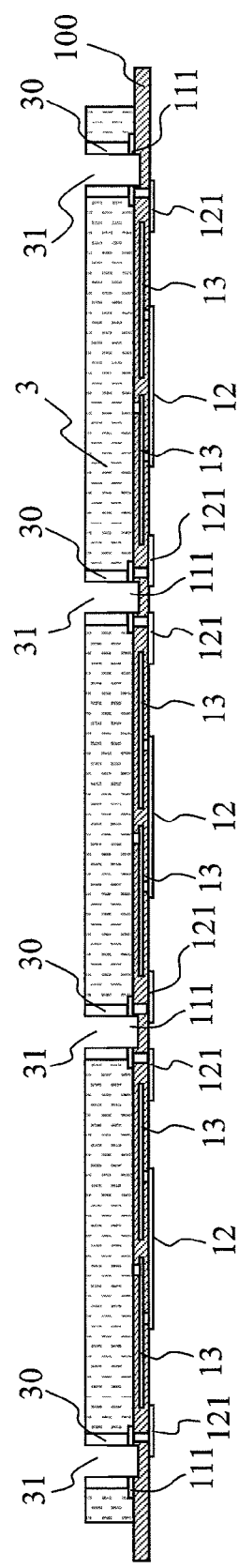
FIG. 58 A sectional view of a collective substrate after the hole-forming step illustrated in FIG. 57.

After the grooves 31 are formed in the groove forming step, holes 30 are formed at areas where the grooves 31 cross each other, that is, over the top surface ground wirings 111 (hole-forming step). FIG. 57 is a plan view schematically illustrating the hole-forming step, and FIG. 58 is a sectional view illustrating a collective substrate after the hole-forming step illustrated in FIG. 22. In the hole-forming step, laser light Ls is to be applied to parts of the sealing resin layer 3 that are over the top surface ground wirings 111, to thereby form the holes 30 (see FIG. 58). Here, the holes 30 are formed to reach the top surface ground wirings 111, by applying laser light Ls of a small beam diameter to sector-shaped parts of the sealing resin layer 3 such that the laser light Ls is not applied to the grooves 31 (see FIG. 58). Incidentally, in a case in which the connection sections 5 are in contact with the internal layer ground wiring 131, in the hole-forming step, the holes 30 are formed to reach the internal layer ground wiring 131. Furthermore, in a case in which the connection sections 5 are directly connected to the bottom surface ground wiring 121, in the hole-forming step, the holes 30 are formed to reach the bottom surface ground wiring 121.

The shape of the holes formed in the hole-forming step in the production process of the semiconductor module F is different from the shape of the holes formed in the hole-forming step in the production process of the semiconductor module B; specifically, the holes formed in the hole-forming step in the production process of the semiconductor module F are sector-shaped. By forming the holes in a sector shape, it is possible to reduce an amount of laser light that reaches parts of the grooves 31 that overlap the top surface ground wirings 111, and thus to reduce an amount by which the parts of the grooves 31 that overlap the top surface ground wirings 111 are dug deeper. That is, it is possible to reduce the risk of the holes 30 being formed by the laser light Ls at parts of the top surface ground wirings 111 that overlap the grooves 31 such that the holes 30 penetrate the collective substrate 111. This makes it possible, in a case where a wet plating method is used in a later-described film-forming step, to reduce the risk of plating solution reaching a rear surface of the collective substrate 100 to soil the rear surface, which is disadvantageous.

Figure 59:
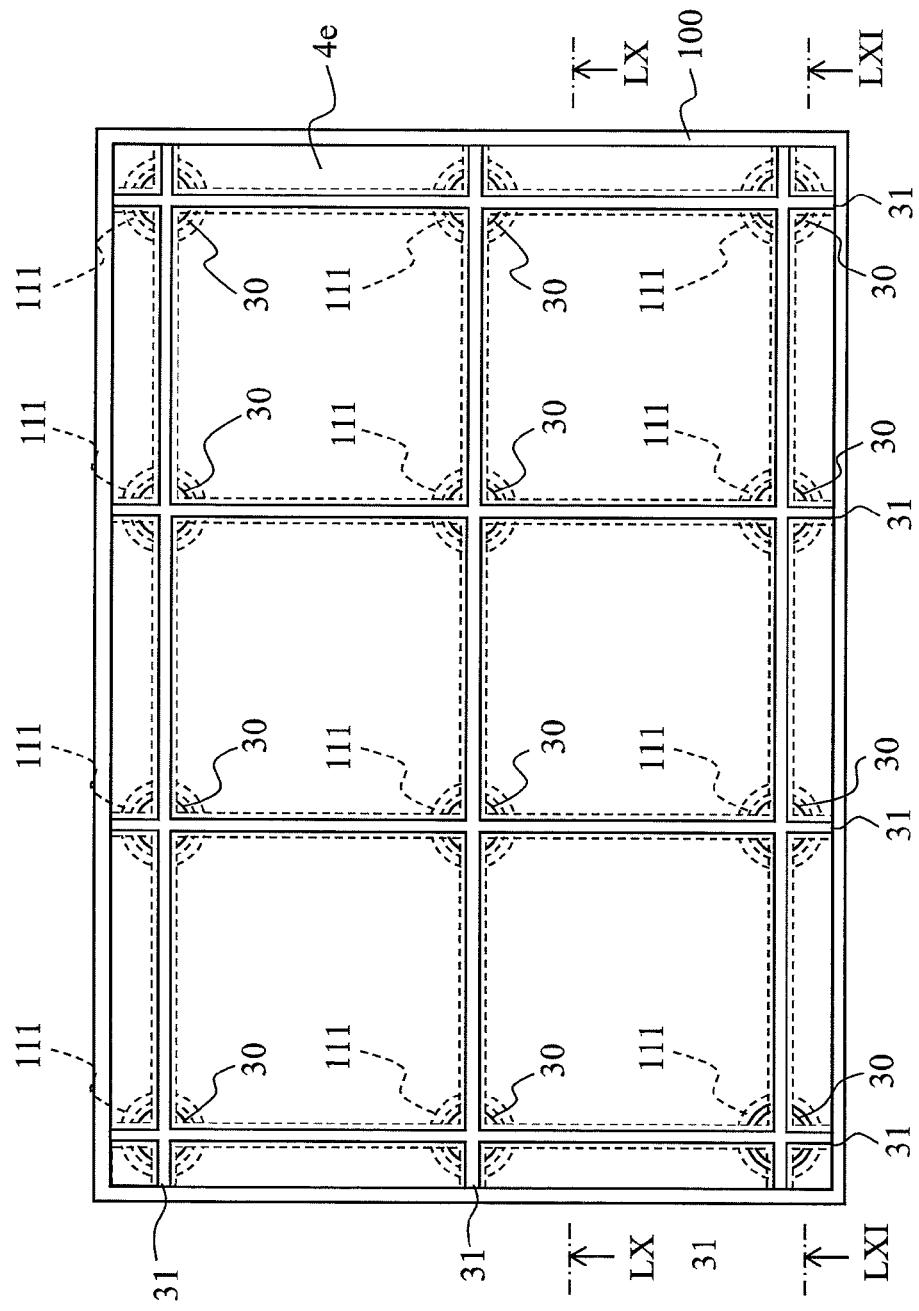
FIG. 59 A plan view of a collective substrate after a film is formed thereon.

After the grooves 31 are formed in the groove-forming step, a metal film is formed to cover the top surface of the collective substrate 100 including the sealing resin layer 3. FIG. 59 is a plan view of the collective substrate 100 after the film is formed thereon, FIG. 60 is a sectional view of the collective substrate 100 illustrated in FIG. 59 taken along line LX-LX of FIG. 59, and FIG. 61 is a sectional view of the collective substrate 100 illustrated in FIG. 59 taken along line LXI-LXI of FIG. 59.

An electrically conductive metal film is formed on the top surface of the sealing resin layer 3 in which the holes 30 and the grooves 31 are formed (a film-forming step). Note that the method of forming the metal film adopted in the film-forming step is the same as the method adopted in the film-forming step performed in the process of producing the semiconductor module A. In the film-forming step, the metal film is formed not only on the top surface of the sealing resin layer 3 but also on bottom surfaces and inner wall surfaces of the holes 30 and those of the grooves 31 (see FIGS. 59, 60, and 61). The parts of the metal film formed on the bottom surfaces of the holes 30 are in contact with the top surface ground wirings 111. Note that the metal film formed in the film-forming step forms the exterior shield 4 and the connection sections 5 illustrated in drawings such as FIGS. 52, 53 and 54.

The collective substrate 100 is, after the exterior shield 4 and the connection sections 5 are formed thereon, cut and separated (a dicing step). FIG. 62 is a sectional view illustrating a collective substrate cut in the dicing step. The dicing step is equivalent to the dicing step of the process of producing the individual semiconductor modules A. Dicing lines on which a dicing blade Db moves are in middle parts of the bottom surfaces of the grooves 31, and the dicing blade Db cuts the bottom surfaces of the grooves 31 and those of the holes 30.

In the dicing step, in which the bottom surfaces of the grooves 31 and the holes 30 are cut, a contact surface between the dicing blade Db and the metal film (an exterior shield 4e) is merely a surface corresponding to thickness of the metal film (the exterior shield 4e). Thus, in the dicing step, a contact area between the metal film (the exterior shield 4e) and the dicing blade can be reduced, and this helps reduce occurrence of inconveniences such as abrasion and chipping of the external shield due to friction between the metal film and the dicing blade. Furthermore, by reducing the contact area between the metal film (the exterior shield 4e) and the dicing blade, it is possible to reduce a heavy burden from being imposed on the dicing blade, and thus to prolong the life of the dicing blade, which accordingly helps enhance the productivity in producing the semiconductor modules.

By forming the grooves 31 to partially extend into the collective substrate 100 in the groove-forming step, the electrically conductive metal film also functions to reduce intrusion of water into the sealing resin layer 3 in the form of moisture or the like. Furthermore, by cutting off part of the substrate to form the metal film, boundary parts between the module substrate 1 and the sealing resin layer 3 on the side surfaces of the semiconductor module E are covered with the metal film. This helps enhance the effect of reducing intrusion of water, and thus it is possible to reduce the risk of cracks and the like of the resin occurring in the reflow soldering.

The sixth embodiment is different from the fifth embodiment in that the groove-forming step is performed before the hole-forming step. In the sixth embodiment, since the grooves 31 are formed to partially extend into the collective substrate 100 in the groove-forming step, the grooves 31 are formed at parts that overlap the top surface ground wirings 111. If, thereafter, laser light Ls whose spot diameter is equal to the diameter of the holes 30 is applied, the laser light Ls also reaches some parts of the holes 30 that overlap the grooves 31. In this state, if the hole-forming step is carried out until parts of the holes 30 that do not overlap the grooves 31 reach the top surface ground wiring 111, there is a risk that the parts of the holes 30 overlapping the grooves 31 may penetrate the collective substrate 100. To prevent this, in the sixth embodiment, in the hole-forming step, the range of laser-light irradiation is limited by using laser light Ls of a small spot diameter, so that the grooves 31 are not irradiated with the laser light Ls. Note that, in the fifth embodiment, as described above, the above inconvenience is prevented from occurring by performing the hole-forming step before the groove-forming step.

The other advantages of the sixth embodiment are the same as those of the first embodiment described above.

The embodiments of the present invention described hitherto are not meant to limit the present invention. In addition to the embodiments described above, many modifications and variations are possible within the spirit of the present invention.

The semiconductor module according to the present invention is applicable to electronic apparatuses such as a navigation device, a cellular phone terminal, a digital camera, and a personal digital assistant.

The invention claimed is:

1. A method of producing a semiconductor module, comprising:
    a mounting step of mounting an electronic component on an individual module section of a top surface of a collective substrate;
    a sealing step of sealing the top surface on which the electronic component is mounted with an insulating sealing resin layer;
    a groove-forming step of forming in the sealing resin layer a groove having a depth that does not reach the collective substrate;
    a hole-forming step of forming a hole penetrating the collective substrate and the sealing resin layer;
    a film-forming step of forming an electrically conductive film made of an electrically conductive material so as to cover a top surface of the sealing resin layer, an internal surface of the groove, a bottom surface of the groove, and an internal surface of the hole; and
    a separation step of cutting the bottom surface of the groove to thereby separate from each other a plurality of individual module sections which the individual module section comprises.

2. The method of producing a semiconductor module according to claim 1, wherein the hole-forming step forms the hole such that the hole penetrates a part of the collective substrate where no wiring is formed.

3. The method of producing a semiconductor module according to claim 1, wherein the hole-forming step forms a plurality of holes as the hole such that at least one of the plurality of holes is formed on an edge of the individual module section.

4. The method of producing a semiconductor module according to claim 1, wherein the individual module section has a rectangular shape; and the hole-forming step forms a plurality of holes and at least one of the plurality of holes is formed at a corner of the individual module section.

5. The method of producing a semiconductor module according to claim 1, wherein the hole-forming step forms a plurality of holes and at least one of the plurality of holes is formed across two or more of the plurality of individual module sections.

6. The method of producing a semiconductor module according to claim 1, wherein the film-forming step forms the electrically conductive film on the internal surface of the hole in such a manner that the electrically conductive material does not fill the hole.

7. The method of producing a semiconductor module according to claim 1, wherein the groove-forming step is performed after the sealing step but before the film-forming step.

8. The method of producing a semiconductor module according to claim 1,
wherein
the film-forming step forms the electrically conductive film on the internal surface of the groove in such a manner that the electrically conductive material does not fill the groove.

* * * * *